US012795938B2

(12) United States Patent
Noh et al.

(10) Patent No.: US 12,795,938 B2
(45) Date of Patent: Nov. 10, 2026

(54) SEMICONDUCTOR DEVICES

(71) Applicant: Samsung Electronics Co., Ltd., Suwon-si (KR)

(72) Inventors: Suseong Noh, Suwon-si (KR); Yongseok Kim, Suwon-si (KR); Daewon Ha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 745 days.

(21) Appl. No.: 18/108,722

(22) Filed: Feb. 13, 2023

(65) Prior Publication Data

US 2024/0015975 A1 Jan. 11, 2024

(30) Foreign Application Priority Data

Jul. 7, 2022 (KR) ........................ 10-2022-0083570

(51) Int. Cl.
*H10B 51/20* (2023.01)
*H10B 51/30* (2023.01)

(52) U.S. Cl.
CPC ............. *H10B 51/20* (2023.02); *H10B 51/30* (2023.02)

(58) Field of Classification Search
CPC ........ H10B 51/20; H10B 51/30; H10B 51/10; H10D 64/033; H10D 64/689
See application file for complete search history.

(56) References Cited

U.S. PATENT DOCUMENTS 10,910,393 B2 2/2021 Lai et al.
11,171,157 B1 11/2021 Lai et al.
11,227,896 B2 1/2022 Noh et al.
2018/0151746 A1* 5/2018 Tu ........................ H10D 64/689
2021/0126013 A1* 4/2021 Lai ........................ H10D 30/025
2021/0175252 A1* 6/2021 Han ........................ H10D 30/63
2021/0217775 A1* 7/2021 Zhang .................. H10D 64/033
2021/0272983 A1 9/2021 Gilbert et al.
2021/0375928 A1 12/2021 Wu et al.
2021/0375929 A1 12/2021 Lu et al.
2021/0375940 A1 12/2021 Lu et al.

FOREIGN PATENT DOCUMENTS

KR 100876136 B1 12/2008
KR 10-2020-0078048 A 7/2020
KR 10-2021-0072636 A 6/2021

* cited by examiner

*Primary Examiner* — Shih Tsun A Chou

(74) *Attorney, Agent, or Firm* — Wolf, Greenfield & Sacks, P.C.

(57) ABSTRACT

A semiconductor device may include first conductive lines on a substrate and spaced apart from each other in a first direction, second conductive lines spaced apart from the first conductive lines in a second direction, third conductive lines spaced apart from the second conductive lines in the second direction, gate electrodes between the first, second and third conductive lines and extending in the first direction, ferroelectric patterns on respective side surfaces of the gate electrodes, gate insulating patterns on the respective side surfaces of the gate electrodes and spaced apart from the respective side surfaces of the gate electrodes with the ferroelectric patterns respectively therebetween, and channel patterns extending along respective side surfaces of the gate insulating patterns. Each of the channel patterns may be electrically connected to the second conductive lines, respectively, and may be electrically connected to the first conductive lines or the third conductive lines, respectively.

19 Claims, 26 Drawing Sheets

SEMICONDUCTOR DEVICES

CROSS-REFERENCE TO RELATED APPLICATIONS

This U.S. non-provisional patent application claims priority under 35 U.S.C. § 119 to Korean Patent Application No. 10-2022-0083570, filed on Jul. 7, 2022, in the Korean Intellectual Property Office, the entire contents of which are hereby incorporated by reference.

BACKGROUND OF THE INVENTION

The present disclosure relates to a semiconductor device and a method of fabricating the same, and in particular, to a semiconductor memory device including a ferroelectric field effect transistor and a method of fabricating the same.

Semiconductor memory devices are generally classified into volatile memory devices and nonvolatile memory devices. The volatile memory devices lose their stored data when their power supplies are interrupted, and for example, include a dynamic random access memory (DRAM) device and a static random access memory (SRAM) device. The nonvolatile memory devices maintain their stored data even when their power supplies are interrupted and, for example, include a programmable read only memory (PROM), an erasable PROM (EPROM), an electrically EPROM (EEPROM), and a flash memory device. In addition, to meet an increasing demand for a semiconductor memory device with high performance and low power consumption, next-generation nonvolatile semiconductor memory devices, such as magnetic random access memory (MRAM), phase-change random access memory (PRAM), and ferroelectric random access memory (FeRAM) devices, are being developed. As a semiconductor device with high integration density and high performance is required, various studies are being conducted to develop semiconductor devices having different properties.

SUMMARY

An embodiment of the inventive concept provides a highly-integrated semiconductor device and a method of fabricating the same.

An embodiment of the inventive concept provides a semiconductor device with improved operational and reliability characteristics and a method of fabricating the same.

According to an embodiment of the inventive concept, a semiconductor device may include first conductive lines on a substrate and spaced apart from each other in a first direction perpendicular to a top surface of the substrate, second conductive lines spaced apart from the first conductive lines in a second direction parallel to the top surface of the substrate, third conductive lines spaced apart from the second conductive lines in the second direction, gate electrodes between the first conductive lines and the second conductive lines and between the second conductive lines and the third conductive lines and extending in the first direction, ferroelectric patterns on respective side surfaces of the gate electrodes, gate insulating patterns on the respective side surfaces of the gate electrodes and spaced apart from the respective side surfaces of the gate electrodes with the ferroelectric patterns respectively therebetween, and channel patterns extending along respective side surfaces of the gate insulating patterns. Each of the channel patterns may be electrically connected to a respective one of the second conductive lines and may be electrically connected to a respective one of the first conductive lines or a respective one of the third conductive lines.

According to an embodiment of the inventive concept, a semiconductor device may include first insulating patterns stacked on a substrate and spaced apart from each other in a first direction perpendicular to a top surface of the substrate, first conductive lines and second conductive lines on the substrate, wherein the second conductive lines are spaced apart from the first conductive lines in a second direction parallel to the top surface of the substrate, a first gate electrode that is spaced apart from the first conductive lines and the second conductive lines and extends in the first direction, channel patterns that are spaced apart from each other in the first direction and extend along a side surface of the first gate electrode, a ferroelectric pattern between the channel patterns and the first gate electrode, and a gate insulating pattern between the channel patterns and the ferroelectric pattern. The first insulating patterns may be alternately stacked with the channel patterns in the first direction, and the channel patterns may be electrically connected to the second conductive lines, respectively.

According to an embodiment of the inventive concept, a semiconductor device may include a substrate, first conductive lines on the substrate and spaced apart from each other in a first direction perpendicular to a top surface of the substrate, second conductive lines spaced apart from the first conductive lines in a second direction parallel to the top surface of the substrate, third conductive lines spaced apart from the second conductive lines in the second direction, the second conductive lines being between the first conductive lines and the third conductive lines, gate electrodes that are on the substrate, are spaced apart from each other, and extend in the first direction, the gate electrodes comprising a first gate electrode between the first conductive lines and the second conductive lines and a second gate electrode between the second conductive lines and the third conductive lines, channel patterns extending along respective side surfaces of the gate electrodes, ferroelectric patterns on the respective side surfaces of the gate electrodes, gate insulating patterns on the respective side surfaces of the gate electrodes and spaced apart from the respective side surfaces of the gate electrodes with the ferroelectric patterns respectively therebetween, and first insulating patterns alternately stacked with ones of the channel patterns in the first direction. The first gate electrode and the second gate electrode may be offset from each other in a third direction that is parallel to the top surface of the substrate and is non-parallel to the second direction. Each of the channel patterns may be electrically connected to a respective one of the second conductive lines and may be electrically connected to a respective one of the first conductive lines or a respective one of the third conductive lines.

DETAILED DESCRIPTION

Figure 1:
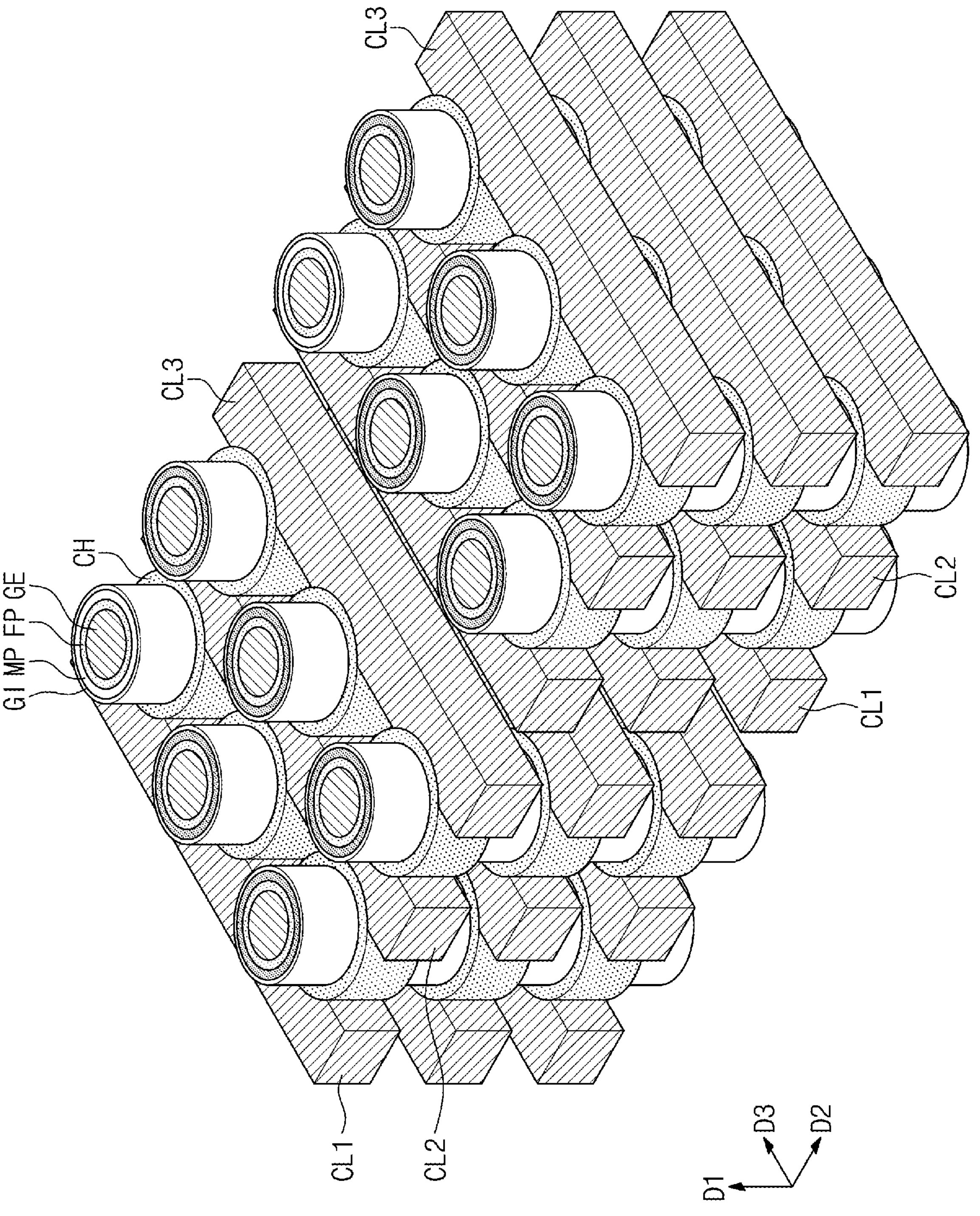
FIG. 1 is a perspective view schematically illustrating a semiconductor device according to an embodiment of the inventive concept.

Example embodiments of the inventive concepts will now be described more fully with reference to the accompanying drawings, in which example embodiments are shown. Like reference numerals in the drawings denote like elements, and thus their description will be omitted.

Figure 2:
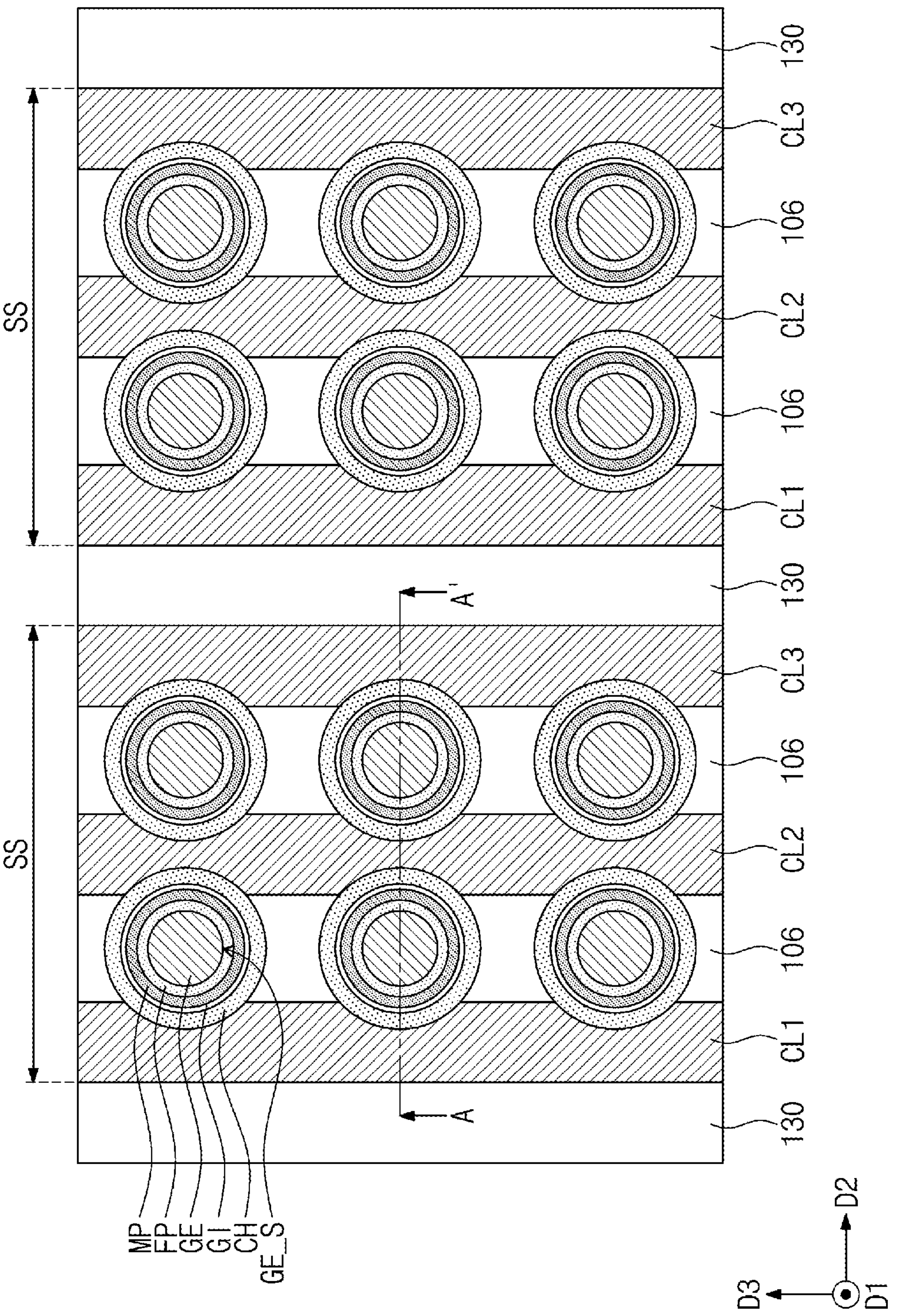
FIG. 2 is a plan view illustrating a semiconductor device according to an embodiment of the inventive concept.
Figure 3:
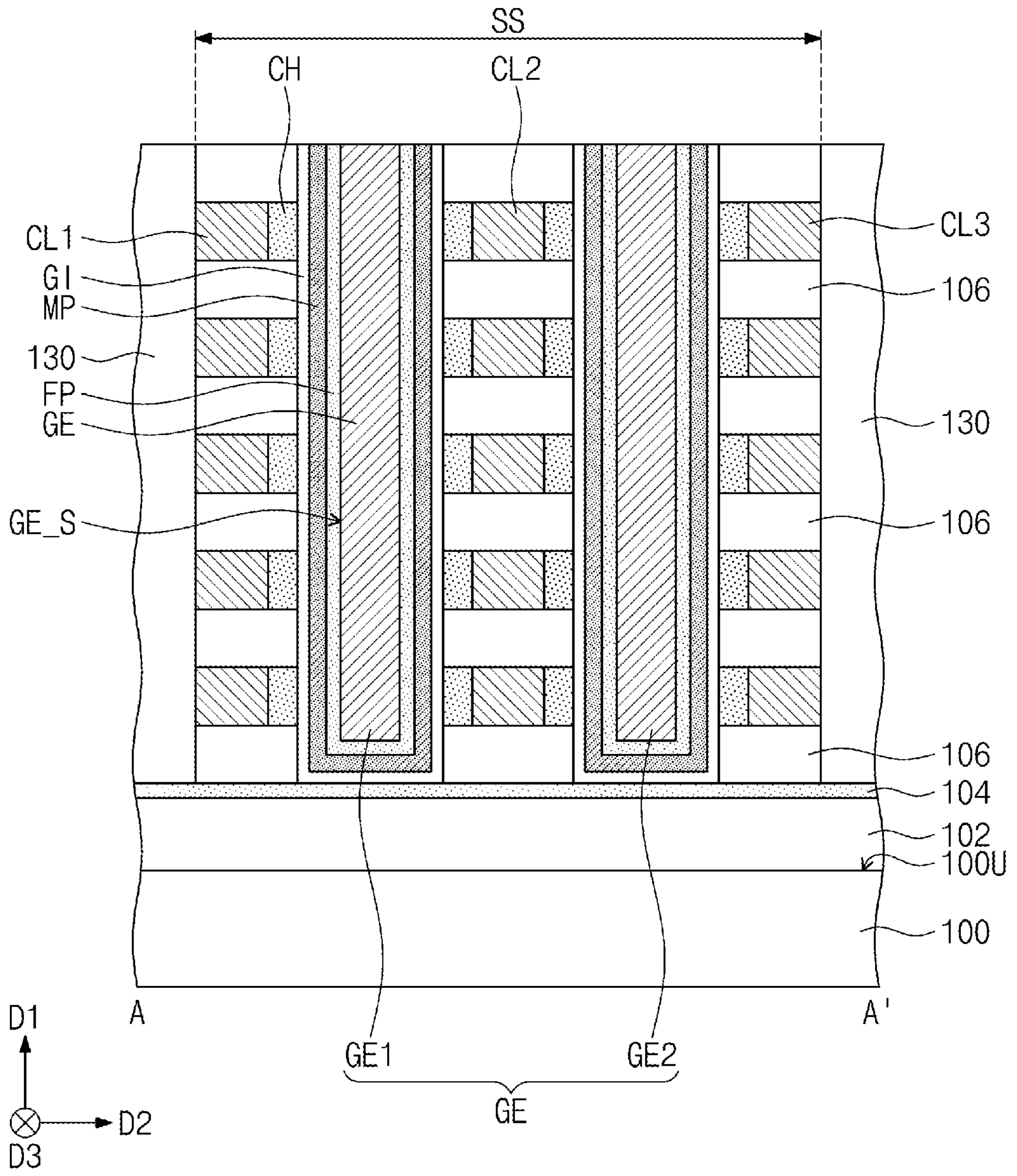
FIG. 3 is a sectional view taken along a line A-A' of FIG. 2.

FIG. 1 is a schematic perspective view illustrating a semiconductor device according to an embodiment of the inventive concept. FIG. 2 is a plan view illustrating a semiconductor device according to an embodiment of the inventive concept. FIG. 3 is a sectional view taken along a line A-A' of FIG. 2.

Referring to FIGS. 1 to 3, an interlayer insulating layer 102 and an etch stop layer 104 may be sequentially disposed on a substrate 100. The interlayer insulating layer 102 may be disposed between the substrate 100 and the etch stop layer 104. The substrate 100 may include a semiconductor substrate (e.g., a silicon substrate, a germanium substrate, or a silicon-germanium substrate, and so forth). The interlayer insulating layer 102 may be formed of or include at least one of silicon oxide, silicon nitride, and/or silicon oxynitride, and the etch stop layer 104 may be formed of or include at least one of metal oxides (e.g., aluminum oxide).

A stack SS may be disposed on the etch stop layer 104. The stack SS may include first conductive lines CL1, which are separated from each other in a first direction D1 perpendicular to a top surface 100U of the substrate 100, second conductive lines CL2, which are spaced apart from the first conductive lines CL1 in a second direction D2 parallel to the top surface 100U of the substrate 100, and third conductive lines CL3, which are spaced apart from the second conductive lines CL2 in the second direction D2. The second conductive lines CL2 may be disposed between the first and third conductive lines CL1 and CL3. The first conductive lines CL1 may be extended in a third direction D3, which is parallel to the top surface 100U of the substrate 100 and is not parallel to the second direction D2. As used herein, "an element A extends in a direction X" (or similar language) may mean that the element A extends longitudinally in the direction X. The second conductive lines CL2 may be spaced apart from each other in the first direction D1 and may be extended in the third direction D3. The second conductive lines CL2 may be extended in the third direction D3 and parallel to the first conductive lines CL1. The third conductive lines CL3 may be spaced apart from each other in the first direction D1 and may be extended in the third direction D3. For example, the third conductive lines CL3 may be extended in the third direction D3 to be parallel to the second conductive lines CL2.

The first conductive lines CL1, the second conductive lines CL2, and the third conductive lines CL3 may be formed of or include at least one of conductive materials (e.g., doped polysilicon, metals, conductive metal nitrides, conductive metal silicides, conductive metal oxides, or combinations thereof). For example, the first conductive lines CL1, the second conductive lines CL2, and the third conductive lines CL3 may be formed of or include at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but the inventive concept is not limited to these examples. The first conductive lines CL1, the second conductive lines CL2, and the third conductive lines CL3 may be formed of or include at least one of two-dimensional semiconductor materials (e.g., graphene, carbon nanotube, or combinations thereof).

The stack SS may further include gate electrodes GE. The gate electrodes GE may include first gate electrodes GE1, which are disposed between the first conductive lines CL1 and the second conductive lines CL2, and second gate electrodes GE2, which are disposed between the second conductive lines CL2 and the third conductive lines CL3. The gate electrodes GE may be disposed to cross the first conductive lines CL1, the second conductive lines CL2, and the third conductive lines CL3. The first gate electrodes GE1 between the first conductive lines CL1 and the second conductive lines CL2 may be spaced apart from each other in the third direction D3 and may be extended in the first direction D1. The second gate electrodes GE2 between the second conductive lines CL2 and the third conductive lines CL3 may be spaced apart from each other in the third direction D3 and may be extended in the first direction D1. The gate electrodes GE may be formed of or include at least one of doped polysilicon, metals, conductive metal nitrides, conductive metal silicides, conductive metal oxides, or combinations thereof. For example, the gate electrodes GE may be formed of or include at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but the inventive concept is not limited to these examples.

The stack SS may further include a ferroelectric pattern FP. The ferroelectric pattern FP may be provided to enclose a side surface GE_S and a bottom surface of the gate electrode GE. The ferroelectric pattern FP may be in contact with the gate electrodes GE. A top surface of the ferroelectric pattern FP may be located at substantially the same level as a top surface of the gate electrodes GE in the first direction D1. The ferroelectric pattern FP may be formed of or include hafnium oxide having a ferroelectric property. The ferroelectric pattern FP may further include dopants, and in an embodiment, the dopants may be at least one of Zr, Si, Al, Y, Gd, La, Sc, or Sr. For example, the ferroelectric pattern FP may be formed of or include at least one of $HfO_2$, HfZnO, HfSiO, HfSiON, HfTaO, HfSiO, HfZrO, or combinations thereof. The ferroelectric pattern FP may have an orthorhombic phase.

The stack SS may further include a metal pattern MP. The metal pattern MP may be provided to enclose the side surfaces GE_S of the gate electrodes and may be spaced apart from the side surfaces GE_S of the gate electrodes GE with the ferroelectric pattern FP interposed therebetween. The metal pattern MP may be provided to enclose side and bottom surfaces of the ferroelectric pattern FP. The metal pattern MP may be in contact with the ferroelectric pattern FP. The metal pattern MP may be formed of or include at least one of metallic materials (e.g., Pt) and/or metal oxides (e.g., $RuO_2$, $IrO_2$, and/or $LaSrCoO_3$). The metal pattern MP may be used to easily maintain polarization of the ferroelectric pattern FP.

The stack SS may further include a gate insulating pattern GI. The gate insulating pattern GI may be provided to enclose the side surfaces GE_S of the gate electrodes and may be spaced apart from the side surfaces GE_S of the gate electrodes GE with the ferroelectric pattern FP and the metal pattern MP interposed therebetween. The gate insulating pattern GI may be provided to enclose side and bottom surfaces of the metal pattern MP. The gate insulating pattern GI may be in contact with the metal pattern MP. The gate insulating pattern GI may be formed of or include at least one of silicon oxide, silicon oxynitride, high-k dielectric materials whose dielectric constants are higher than silicon oxide, or combinations thereof. The high-k dielectric materials may be formed of or include metal oxide or metal oxynitride.

The stack SS may further include a plurality of channel patterns CH, which are provided to enclose the side surface GE_S of each of the gate electrodes GE. The channel patterns CH may be provided to enclose a side surface GE_S of a corresponding one of the gate electrodes GE and may be spaced apart from each other in the first direction D1. For example, the channel patterns CH may be spaced apart from the side surfaces GE_S of the gate electrodes GE with the ferroelectric pattern FP, the metal pattern MP, and the gate insulating pattern GI interposed therebetween. The plurality of channel patterns CH may be disposed between the first conductive lines CL1 and the second conductive lines CL2 and between the second conductive lines CL2 and the third conductive lines CL3. The channel patterns CH may be connected to the second conductive lines CL2, respectively. The channel patterns CH may be connected to the first conductive lines CL1 or the third conductive lines CL3, respectively. Each of the channel patterns CH may be connected to a corresponding one of the second conductive lines CL2 and may be connected to a corresponding one of the first or third conductive lines CL1 and CL3. Each of the channel patterns CH may be interposed between the corresponding second conductive line CL2 and the corresponding first conductive line CL1 or between the corresponding second conductive line CL2 and the corresponding third conductive line CL3. When viewed in a sectional view, each of the channel patterns CH may be overlapped (e.g., overlapped in the second direction D2) with the corresponding second conductive line CL2 and the corresponding first conductive line CL1 or overlapped with the corresponding second conductive line CL2 and the corresponding third conductive line CL3. In an embodiment, the corresponding second conductive line CL2 and the third conductive line CL3 may be overlapped with each other horizontally (e.g., in the second direction D2). In an embodiment, the corresponding second conductive line CL2 and the first conductive line CL1 may be overlapped with each other horizontally (e.g., in the second direction D2). In addition, the first gate electrodes GE1 may overlap the first conductive lines CL1 and the second conductive lines CL2 in the second direction D2, and the second gate electrodes GE2 may overlap the second conductive lines CL2 and the third conductive lines CL3 in the second direction D2.

Each of the first conductive lines CL1 may be extended in the third direction D3 and may be connected to adjacent ones of the channel patterns CH enclosing the respective side surfaces GE_S of the gate electrodes GE. Each of the second conductive lines CL2 may be extended in the third direction D3 and may be connected to adjacent ones of the channel patterns CH enclosing the respective side surfaces GE_S of the gate electrodes GE. Each of the third conductive lines CL3 may be extended in the third direction D3 and may be connected to adjacent ones of the channel patterns CH enclosing the respective side surfaces GE_S of the gate electrodes GE.

Each of the channel patterns CH may be provided to enclose a side surface of the gate insulating pattern GI. Each of the channel patterns CH may be in contact with the gate insulating pattern GI enclosing the corresponding gate electrode GE. The channel patterns CH may be formed of or include at least one of silicon (e.g., poly silicon, doped silicon, or single crystalline silicon), germanium, silicon-germanium, or oxide semiconductor materials. The oxide semiconductor materials may include InGaZnO (IGZO), Sn—InGaZnO, InWO (IWO), CuS2, CuSe2, WSe2, InGaSiO, InSnZnO, InZnO (IZO), ZnO, ZnTiO (ZTO), YZnO (YZO), ZnSnO, ZnON, ZrZnSnO, SnO, HfInZnO, GaZnSnO, AlZnSnO, YbGaZnO, InGaO, or combinations thereof. The channel patterns CH may be formed of or include at least one of two-dimensional semiconductor materials (e.g., $MoS_2$, $MoSe_2$, $WS_2$, graphene, carbon nanotube, or combinations thereof).

The stack SS may further include first insulating patterns 106, which are spaced apart from each other in the first direction D1 and are interposed between the channel patterns CH. The first insulating patterns 106 and the channel patterns CH may be alternately stacked in the first direction D1. The channel patterns CH may be electrically separated or disconnected from each other by the first insulating patterns 106. Each of the first insulating patterns 106 may be provided to enclose the side surface GE_S of the corresponding gate electrode GE. The first insulating patterns 106 may be extended into regions between the first conductive lines CL1, between the second conductive lines CL2, and between the third conductive lines CL3. For example, the first conductive lines CL1, the second conductive lines CL2, and the third conductive lines CL3 may each be alternately stacked with the first insulating patterns 106 in the first direction D1. The first insulating patterns 106 may be in contact with the side surface of the gate insulating pattern GI. In an embodiment, the first insulating patterns 106 may be formed of or include silicon oxide.

Insulating sidewall patterns 130 may be disposed on the etch stop layer 104 and on both sides of the stack SS. The insulating sidewall patterns 130 may be spaced apart from each other in the second direction D2 with the stack SS interposed therebetween. The insulating sidewall patterns 130 may be extended in the first direction D1 and the third direction D3. One of the insulating sidewall patterns 130 may be extended in the first direction D1 to cover the side surfaces of the first conductive lines CL1 and the first insulating patterns 106 and may also be extended in the third direction D3 along the side surfaces of the first conductive lines CL1. Another one of the insulating sidewall patterns 130 may be extended in the first direction D1 to cover the side surfaces of the third conductive lines CL3 and the first insulating patterns 106 and may also be extended in the third direction D3 along the side surfaces of the third conductive lines CL3. The insulating sidewall patterns 130 may be formed of or include at least one of, for example, silicon oxide, silicon nitride, and/or silicon oxynitride.

The corresponding gate electrode GE, the ferroelectric pattern FP enclosing the side surface GE_S of the corresponding gate electrode GE, the metal pattern MP enclosing the side surface of the ferroelectric pattern FP, the gate insulating pattern GI enclosing the side surface of the metal pattern MP, and the channel patterns CH connected to the gate insulating pattern GI (e.g., enclosing the side surface of the gate insulating pattern GI) may constitute a ferroelectric field effect transistor. In an embodiment, the first and third conductive lines CL1 and CL3 may be used as bit lines, and the second conductive lines CL2 may be used as source lines.

The channel patterns CH connected to the second conductive lines CL2 may be connected to the corresponding gate electrode GE. That is, the first gate electrodes GE1 and the second gate electrodes GE2 may share the corresponding second conductive line CL2. As an example, the corresponding second conductive line CL2 may be used as a source line. Accordingly, it may be possible to reduce an area and volume of a cell array, compared to the case of disposing a plurality of ferroelectric field effect transistors in a planar manner (e.g., in the second direction D2). As a result, it may be possible to increase an integration density of the semiconductor device and to improve structural stability of the semiconductor device.

Figure 4:
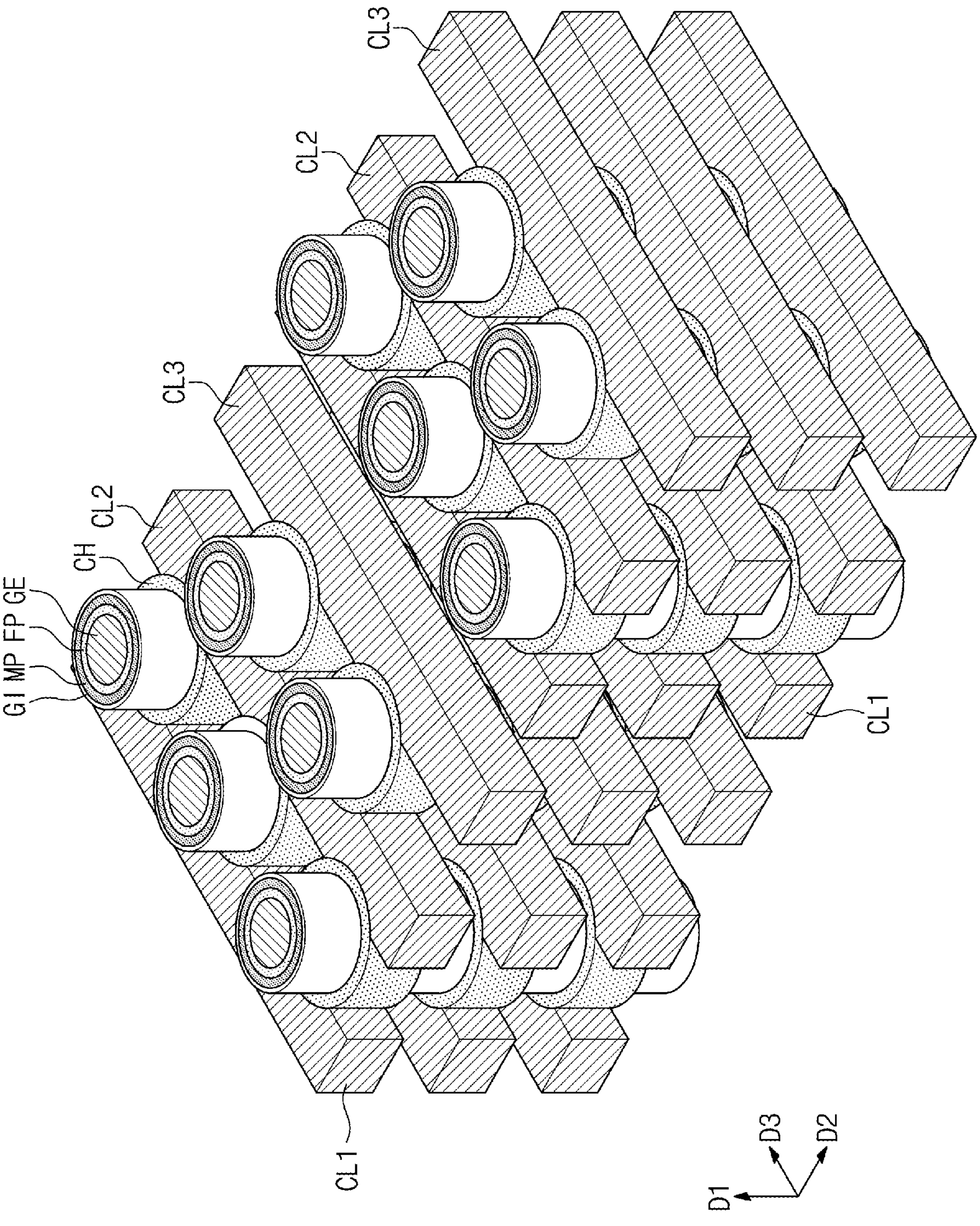
FIG. 4 is a perspective view schematically illustrating a semiconductor device according to an embodiment of the inventive concept.
Figure 5:
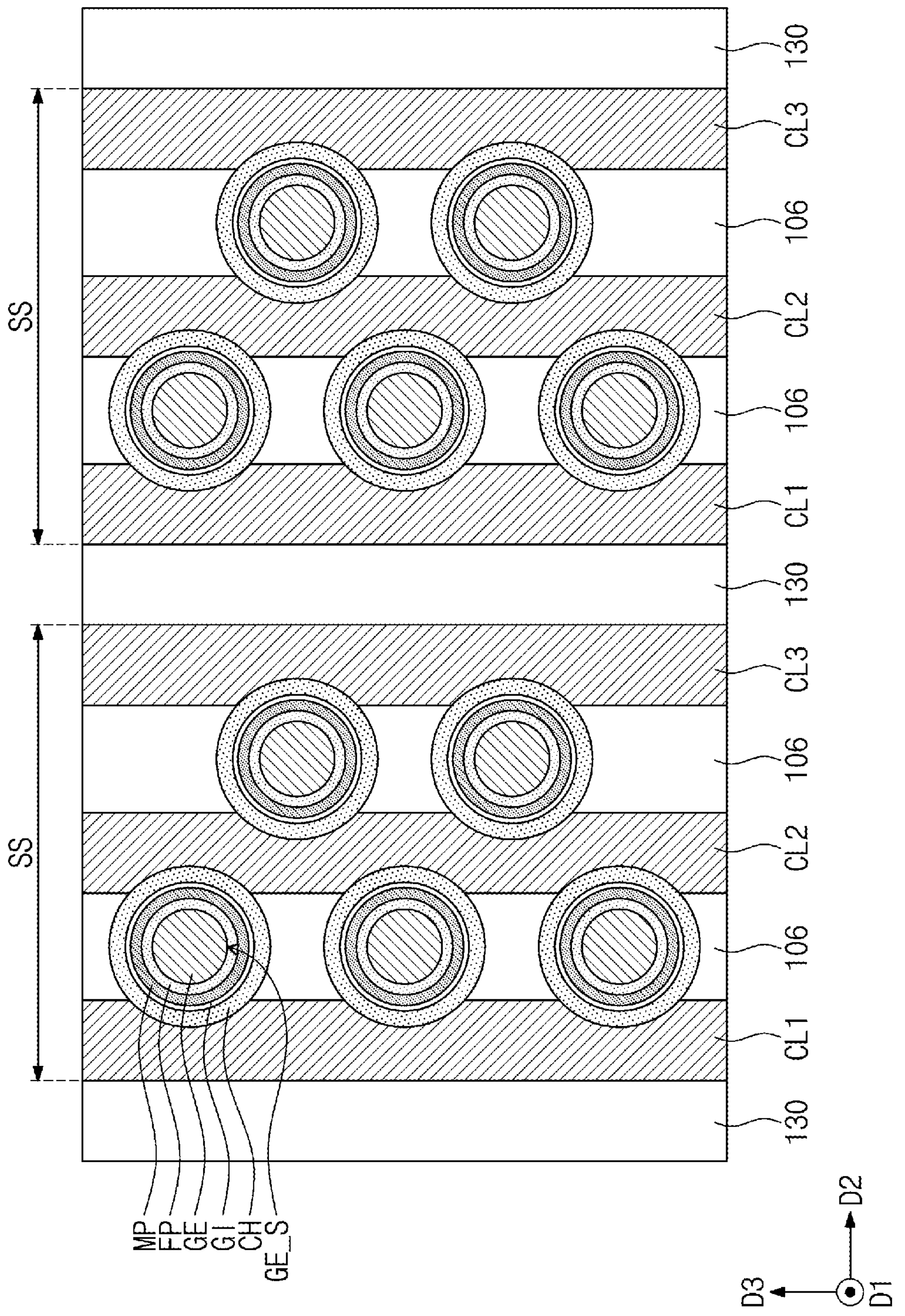
FIG. 5 is a plan view illustrating a semiconductor device according to an embodiment of the inventive concept.

FIG. 4 is a perspective view schematically illustrating a semiconductor device according to an embodiment of the inventive concept. FIG. 5 is a plan view illustrating a semiconductor device according to an embodiment of the inventive concept. For the sake of brevity, features, which are different from the semiconductor device described with reference to FIGS. 1 to 3, will be mainly described below.

Referring to FIGS. 4 and 5, the first gate electrodes GE1 and the second gate electrodes GE2 may be offset from each other in the third direction D3. As used herein, "element A is offset from element B" means that element A may not be aligned with element B along the second direction D2. For example, the first gate electrodes GE1 and the second gate electrodes GE2 may not be aligned with each other along the second direction D2. For example, the first gate electrodes GE1 and the second gate electrodes GE2 may be spaced apart from each other in the third direction D3 in addition to the second direction D2. In other words, the first gate electrodes GE1 and the second gate electrodes GE2 may be arranged in a zigzag shape.

In the case where the first gate electrodes GE1 are offset from the second gate electrodes GE2, a distance between the first gate electrodes GE1 and the second gate electrodes GE2 may be increased, compared with the semiconductor device described with reference to FIGS. 1 to 3. Thus, it may be possible to reduce a disturbance issue, in which the gate electrodes GE are electrically affected by voltages applied to neighboring gate electrodes GE. Accordingly, it may be possible to improve operational and reliability characteristics of the semiconductor device.

Figure 6:
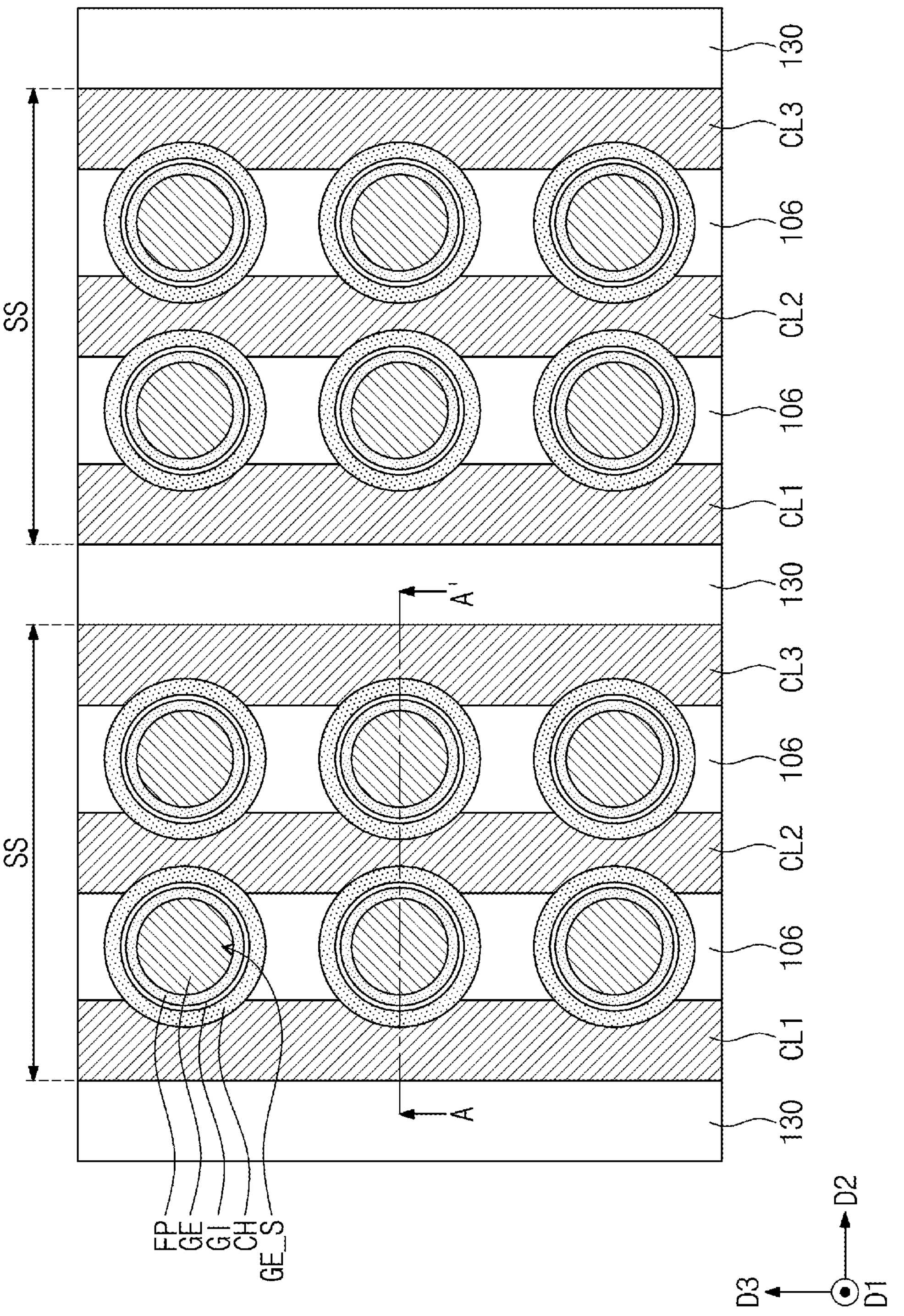
FIG. 6 is a plan view illustrating a semiconductor device according to an embodiment of the inventive concept.
Figure 7:
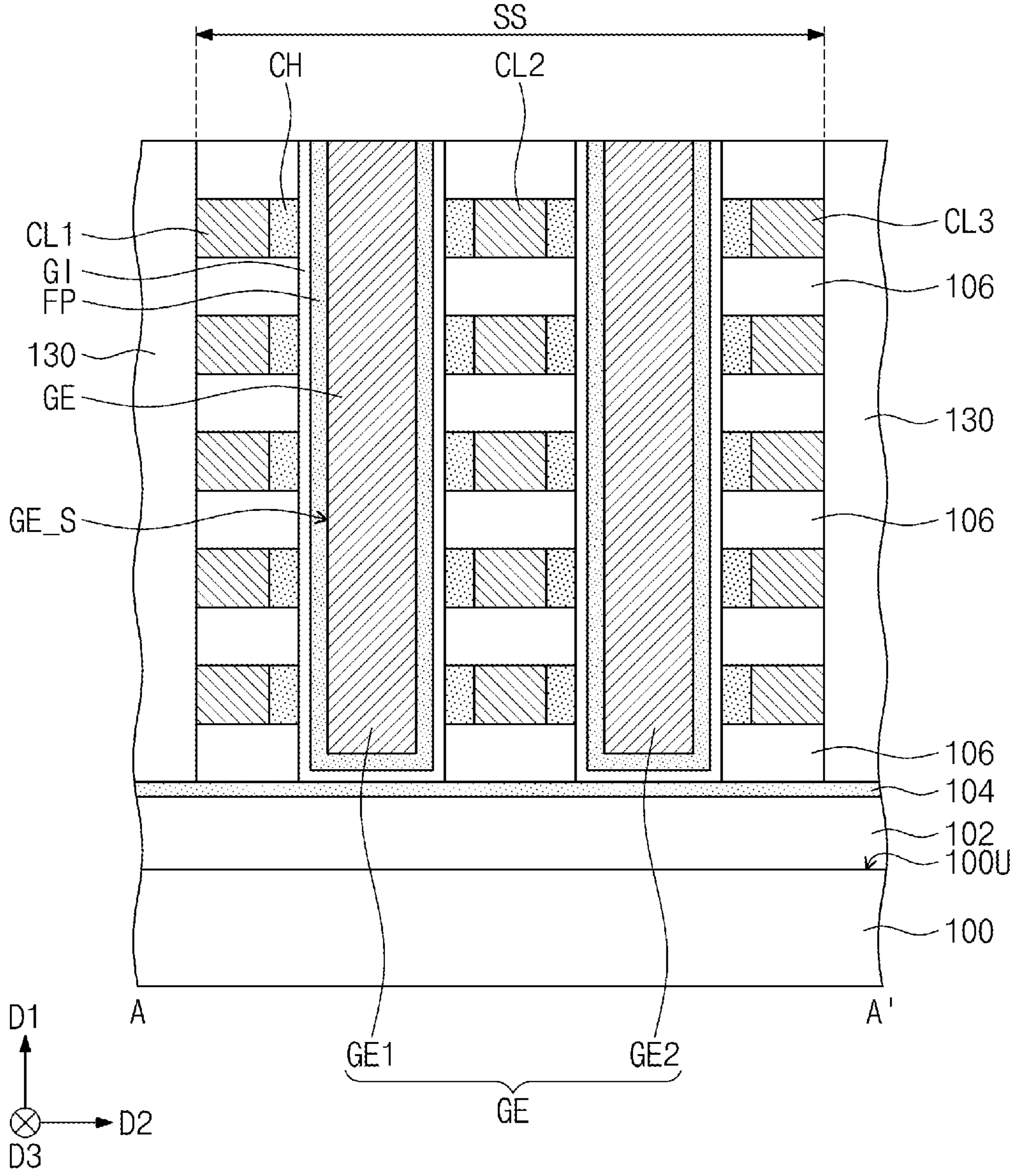
FIG. 7 is a sectional view taken along a line A-A' of FIG. 6.

FIG. 6 is a plan view illustrating a semiconductor device according to an embodiment of the inventive concept. FIG. 7 is a sectional view taken along a line A-A' of FIG. 6. For the sake of brevity, features, which are different from the semiconductor device described with reference to FIGS. 1 to 3, will be mainly described below.

Referring to FIGS. 6 and 7, the stack SS may include the channel patterns CH disposed on a side surface GE_S of a corresponding one of the gate electrodes GE, the ferroelectric pattern FP between the channel patterns CH and the corresponding gate electrode GE, and the gate insulating pattern GI between the channel patterns CH and the ferroelectric pattern FP. In the present embodiment, the stack SS may not include the metal pattern MP between the ferroelectric pattern FP and the gate insulating pattern GI, described with reference to FIGS. 1 to 3. The gate insulating pattern GI may enclose the side surface GE_S of the corresponding gate electrode GE and may be spaced apart from the side surface GE_S of the corresponding gate electrode GE with the ferroelectric pattern FP interposed therebetween. The gate insulating pattern GI may be in contact with a side surface of the ferroelectric pattern FP.

The corresponding gate electrode GE, the ferroelectric pattern FP enclosing the side surface GE_S of the corresponding gate electrode GE, the gate insulating pattern GI enclosing the side surface of the ferroelectric pattern FP, and the channel patterns CH connected to the gate insulating pattern GI (e.g., enclosing the side surface of the gate insulating pattern GI) may constitute a ferroelectric field effect transistor. Except for the afore-described differences, the semiconductor device according to the present embodiments may be configured to have substantially the same features as the semiconductor device described with reference to FIGS. 1 to 3.

FIGS. 8, 10, 12, 14, 16, 18, 20, and 22 are plan views illustrating a method of fabricating a semiconductor device according to an embodiment of the inventive concept, and FIGS. 9, 11, 13, 15, 17, 19, 21, and 23 are sectional views taken along lines A-A' of FIGS. 8, 10, 12, 14, 16, 18, 20, and 22, respectively. For concise description, an element previously described with reference to FIGS. 1 to 3 may be identified by the same reference number without repeating an overlapping description thereof.

Figure 8:
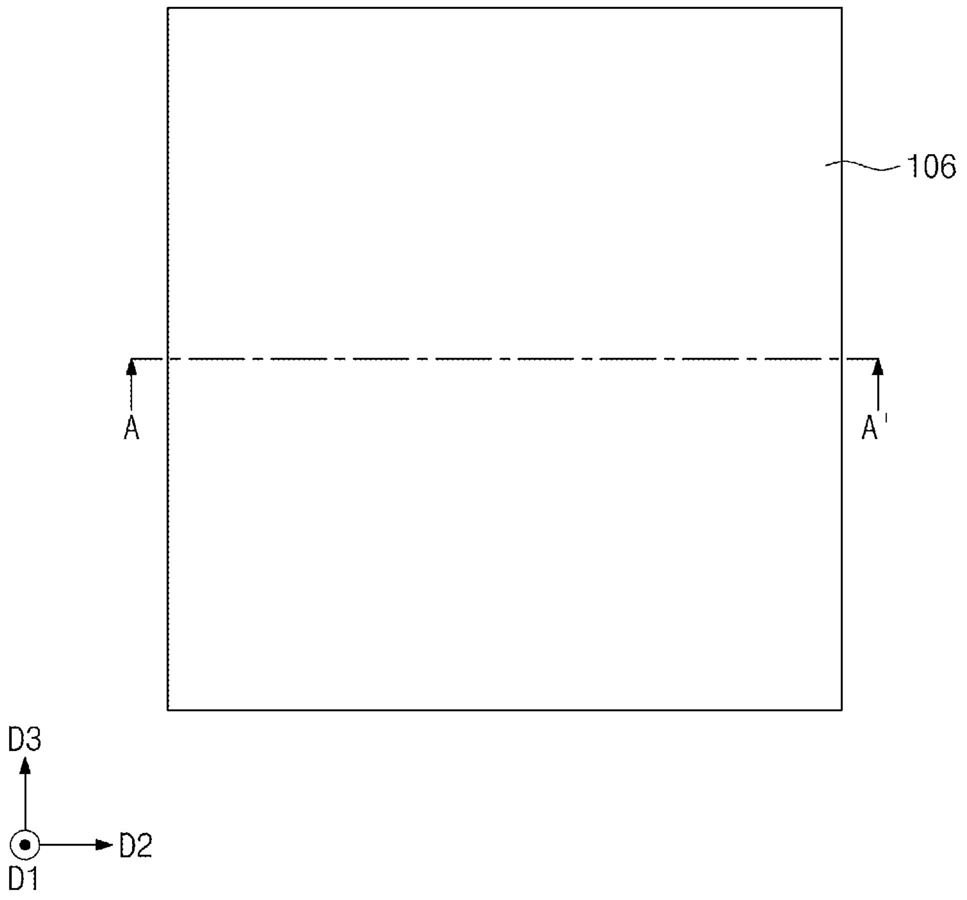
FIGS. 8, 10, 12, 14, 16, 18, 20, and 22 are plan views illustrating a method of fabricating a semiconductor device according to an embodiment of the inventive concept.
Figure 9:
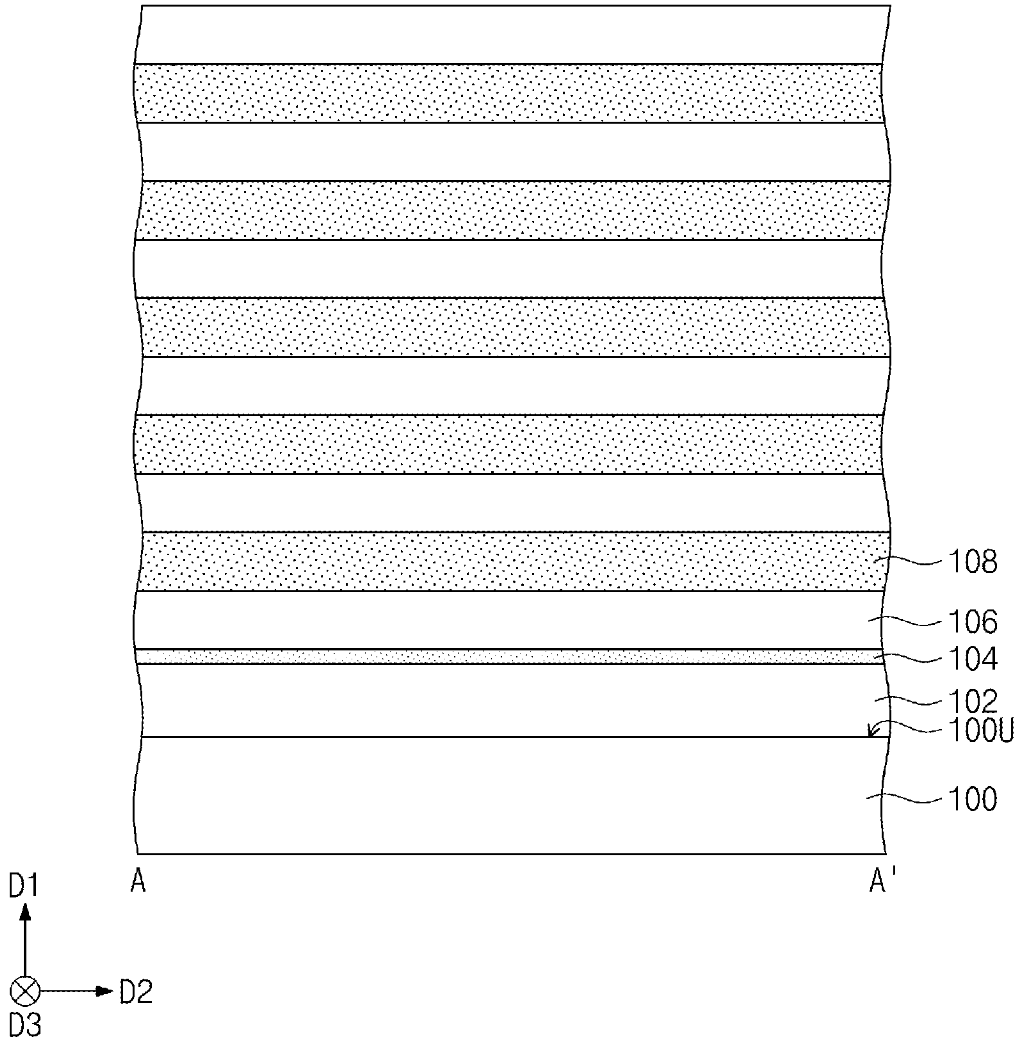
FIGS. 9, 11, 13, 15, 17, 19, 21, and 23 are sectional views taken along lines A-A' of FIGS. 8, 10, 12, 14, 16, 18, 20, and 22, respectively.

Referring to FIGS. 8 and 9, an interlayer insulating layer 102 and an etch stop layer 104 may be sequentially formed on a substrate 100. First insulating layers 106 and second insulating layers 108 may be stacked on the etch stop layer 104. The first and second insulating layers 106 and 108 may be alternately stacked in the first direction D1 that is perpendicular to the top surface 100U of the substrate 100. The lowermost one of the first insulating layers 106 may be interposed between the lowermost one of the second insulating layers 108 and the etch stop layer 104, and the uppermost one of the first insulating layers 106 may be disposed on the uppermost one of the second insulating layers 108. In an embodiment, the first insulating layers 106 may be formed of or include silicon oxide. The second insulating layers 108 may be formed of or include a material (e.g., silicon nitride) having an etch selectivity with respect to the first insulating layers 106.

Figure 10:
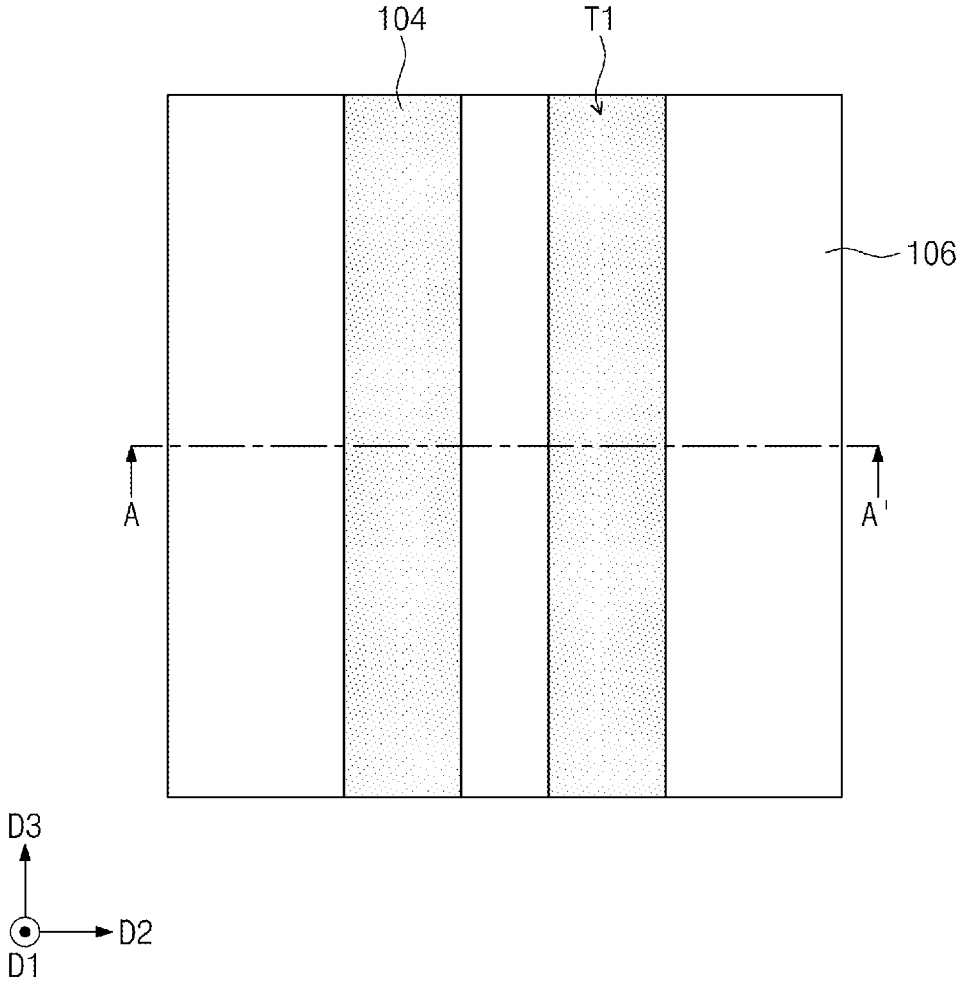
Figure 11:
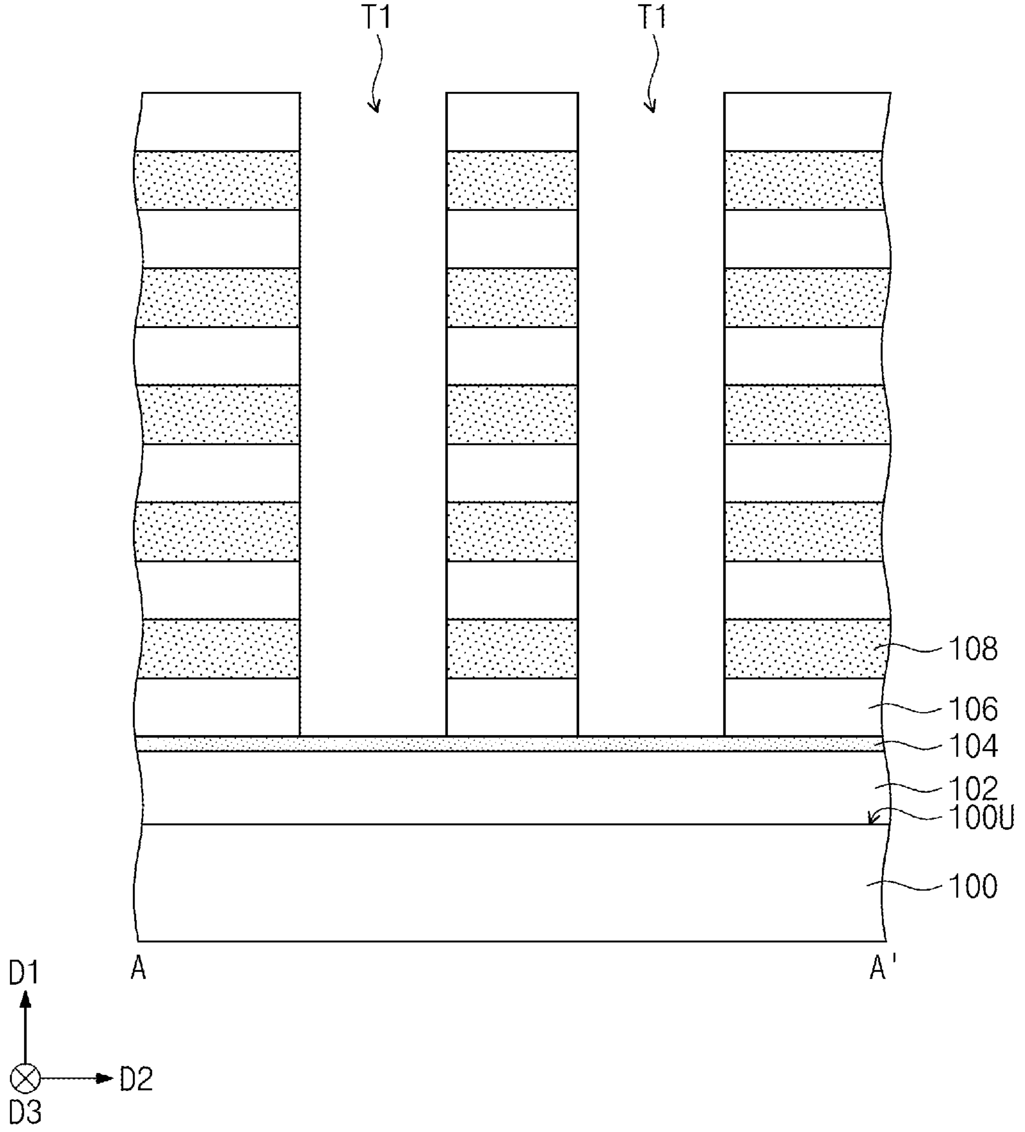

Referring to FIGS. 10 and 11, first trenches T1 may be formed in the first and second insulating layers 106 and 108. Each of the first trenches T1 may be formed to penetrate the first and second insulating layers 106 and 108 in the first direction D1 and to expose a top surface of the etch stop layer 104. The first trenches T1 may be spaced apart from each other in the second direction D2, which is parallel to the top surface 100U of the substrate 100, and may be extended in the third direction D3, which is parallel to the top surface 100U of the substrate 100. The third direction D3 may not be parallel to the second direction D2. In an embodiment, the formation of the first trenches T1 may include anisotropically etching the first and second insulating layers 106 and 108.

Figure 12:
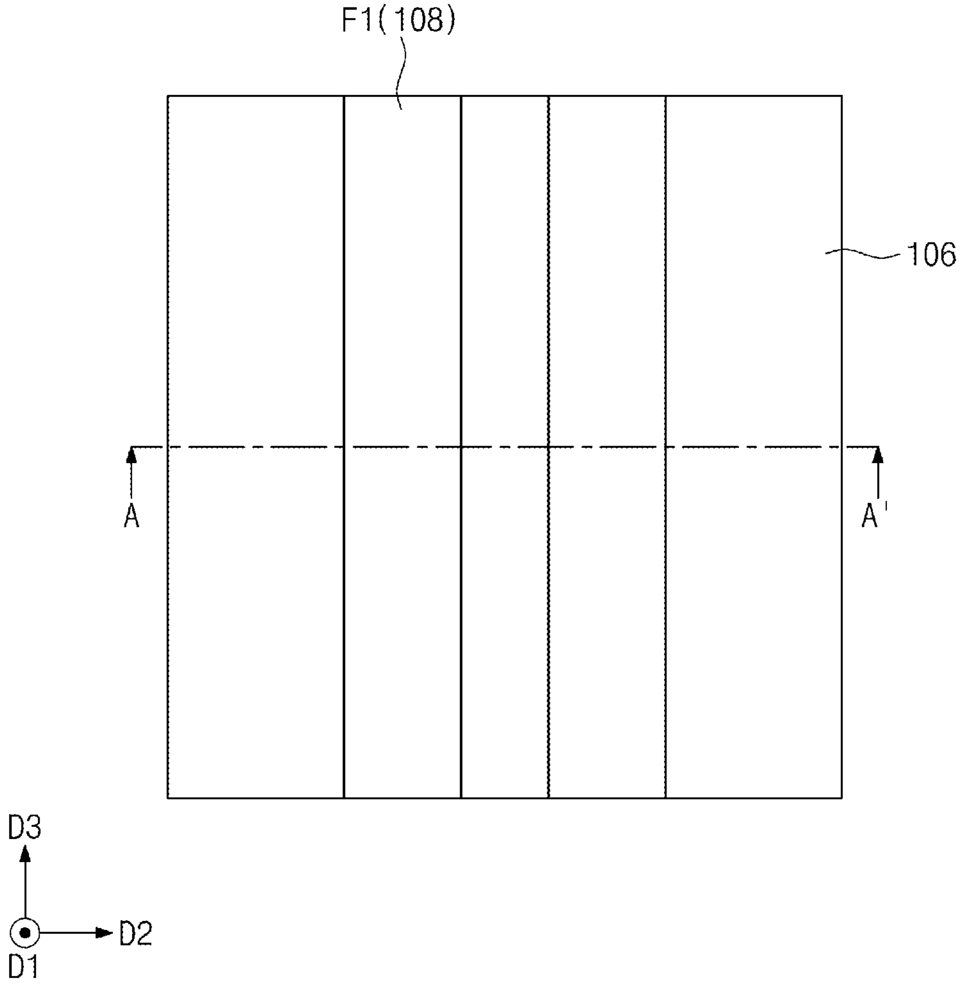
Figure 13:
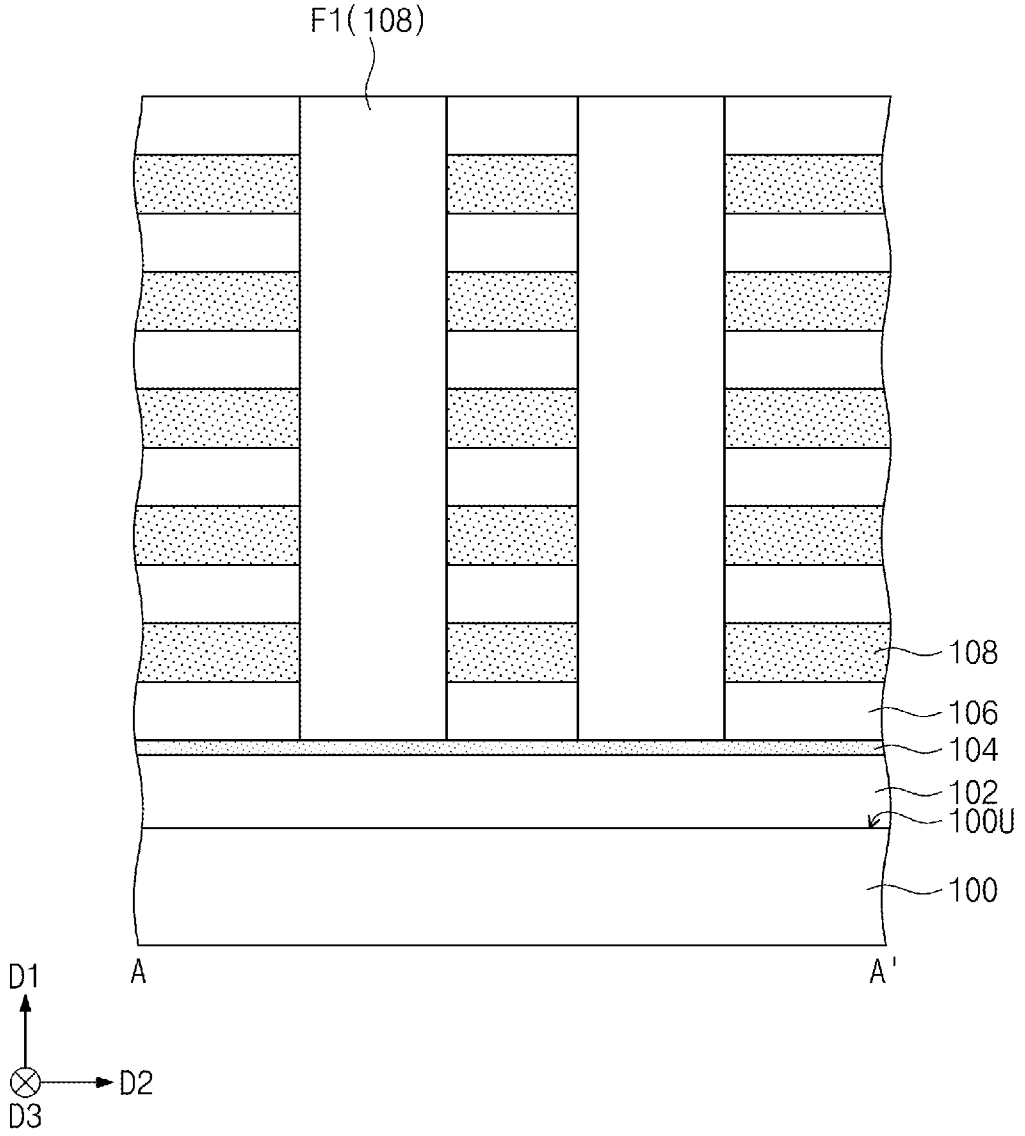

Referring to FIGS. 12 and 13, first filling patterns F1 may be formed in the first trenches T1, respectively. The first filling patterns F1 may be formed to fill the first trenches T1, respectively. The first filling patterns F1 may be spaced apart from each other in the second direction D2 and may be extended in the third direction D3. In an embodiment, the first filling pattern F1 may be formed to cover an inner surface of the first trench T1. The first filling pattern F1 may have a top surface that is located at substantially the same level as a top surface of the uppermost one of the upper first insulating layers 106 in the first direction D1. The first filling patterns F1 may be formed of or include a material having etch selectivity with respect to the first insulating layer 106. As an example, the first filling patterns F1 may be formed of or include substantially the same material as the second insulating layer 108. Hereinafter, remaining portions of the first insulating layer 106 will be referred to as "first insulating patterns 106". Also, remaining portions of the first filling patterns F1 and the second insulating layer 108 will be referred to as "second insulating patterns 108".

Figure 14:
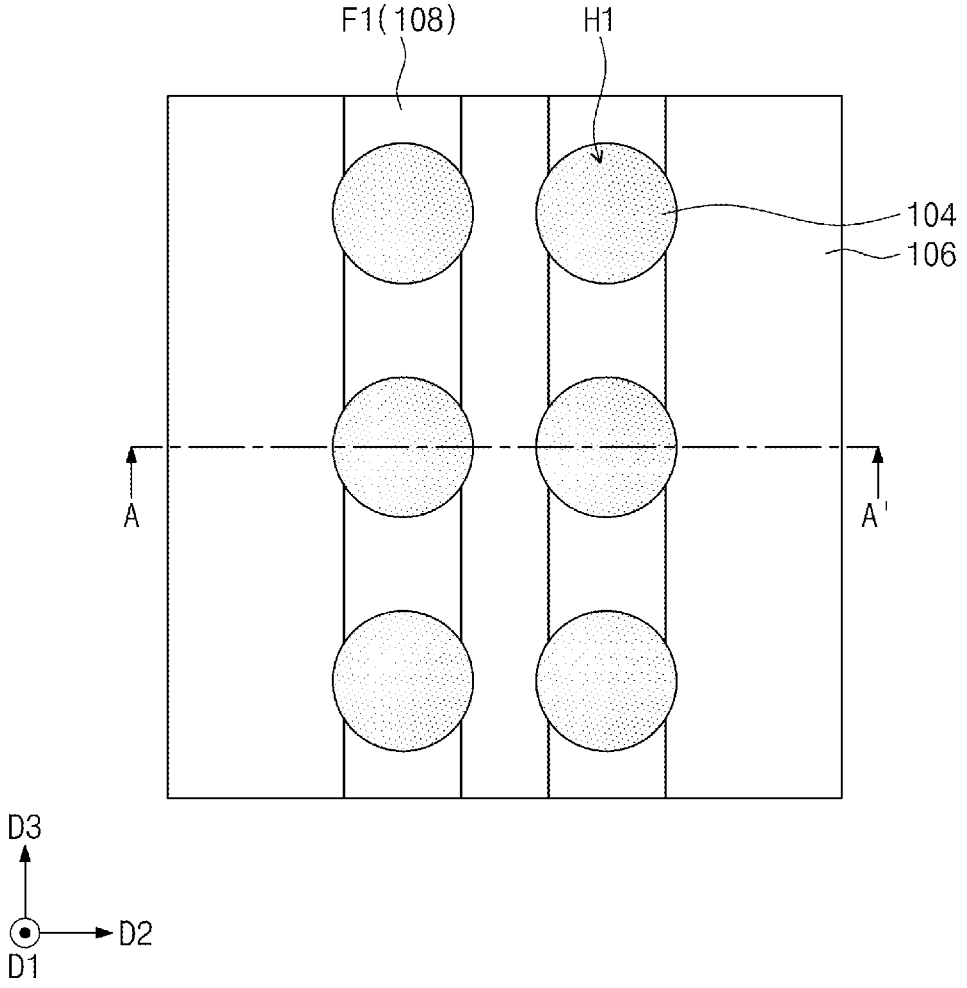
Figure 15:
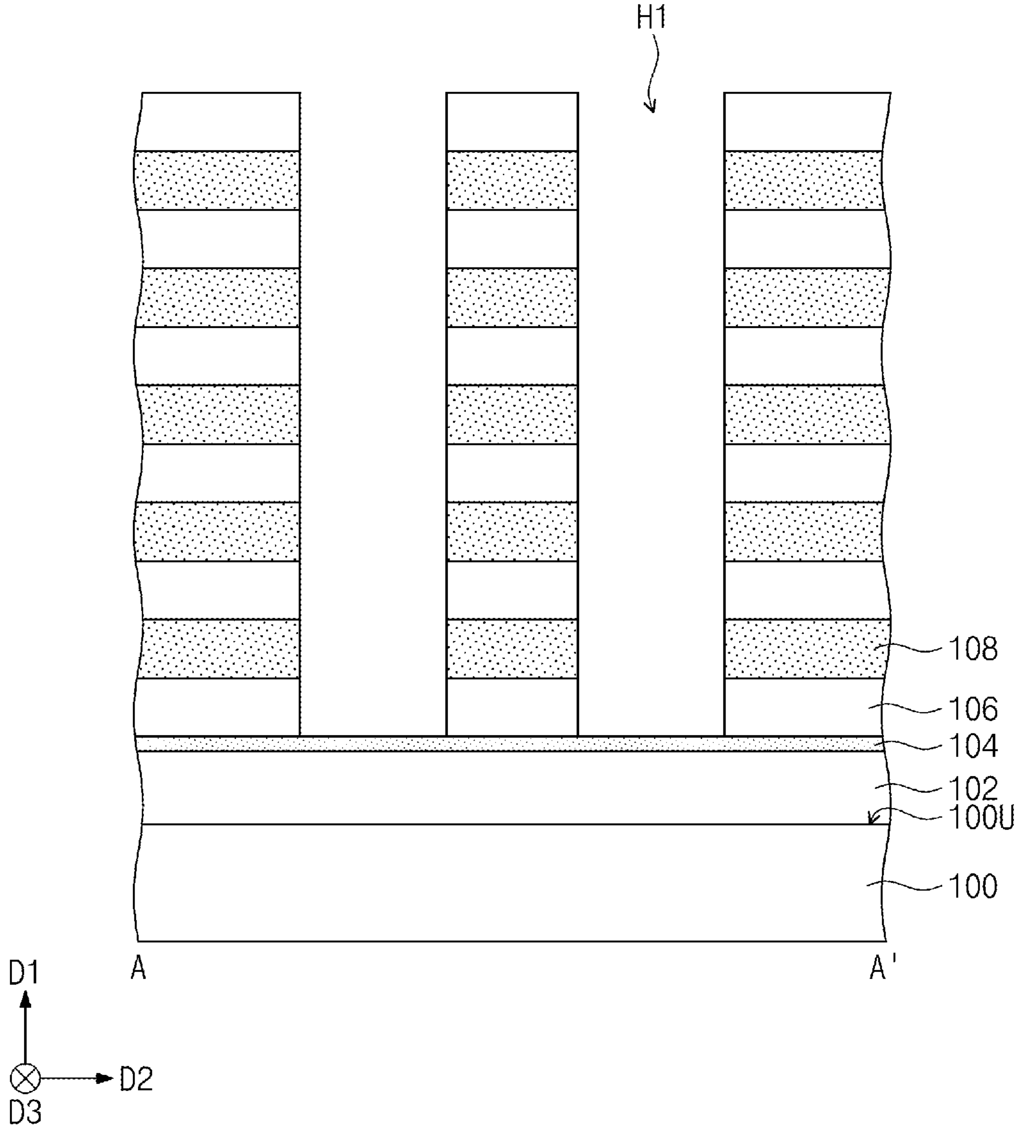

Referring to FIGS. 14 and 15, first holes H1 may be formed. Each of the first holes H1 may be formed to extend in the first direction D1, to penetrate the first insulating pattern 106 and the second insulating pattern 108, and to expose a top surface of the etch stop layer 104. The first holes H1 may be spaced apart from each other in the third direction D3. Each of the first holes H1 may be formed to expose side surfaces of the first and second insulating patterns 106 and 108. In an embodiment, the formation of the first holes H1 may include anisotropically etching the first and second insulating patterns 106 and 108.

Figure 16:
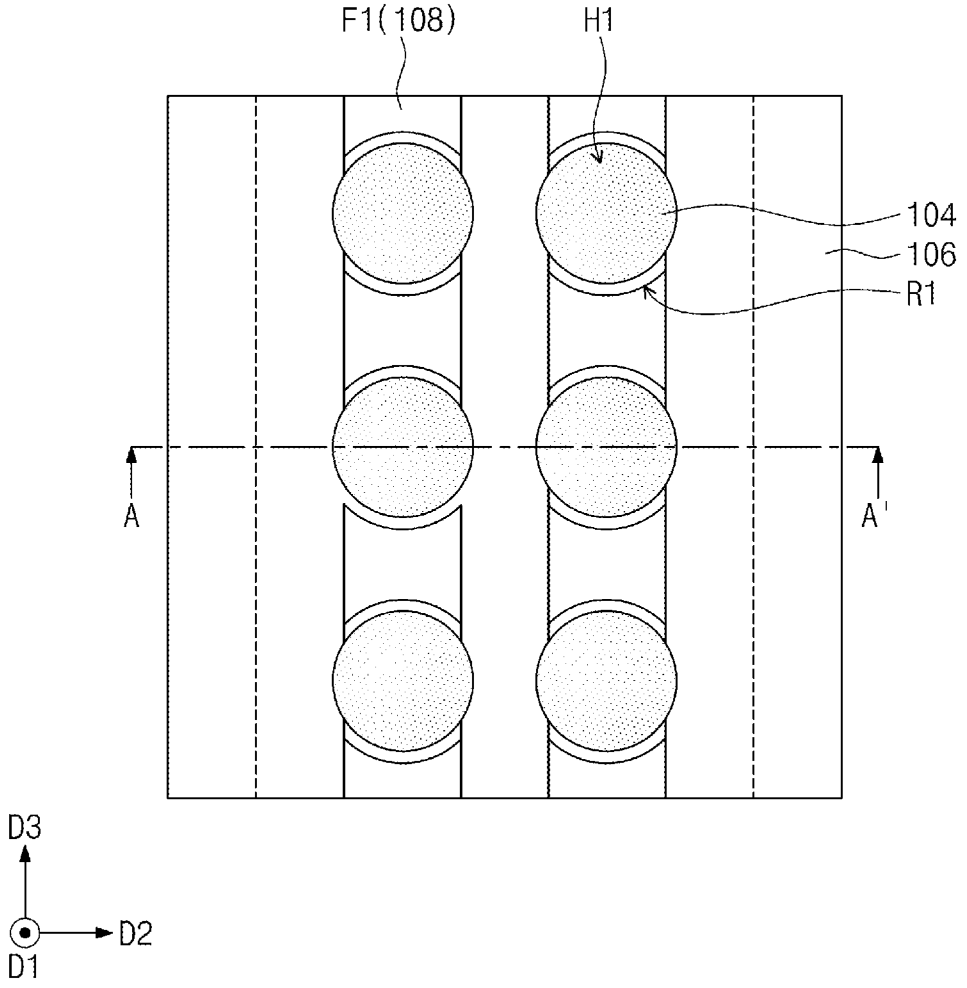
Figure 17:
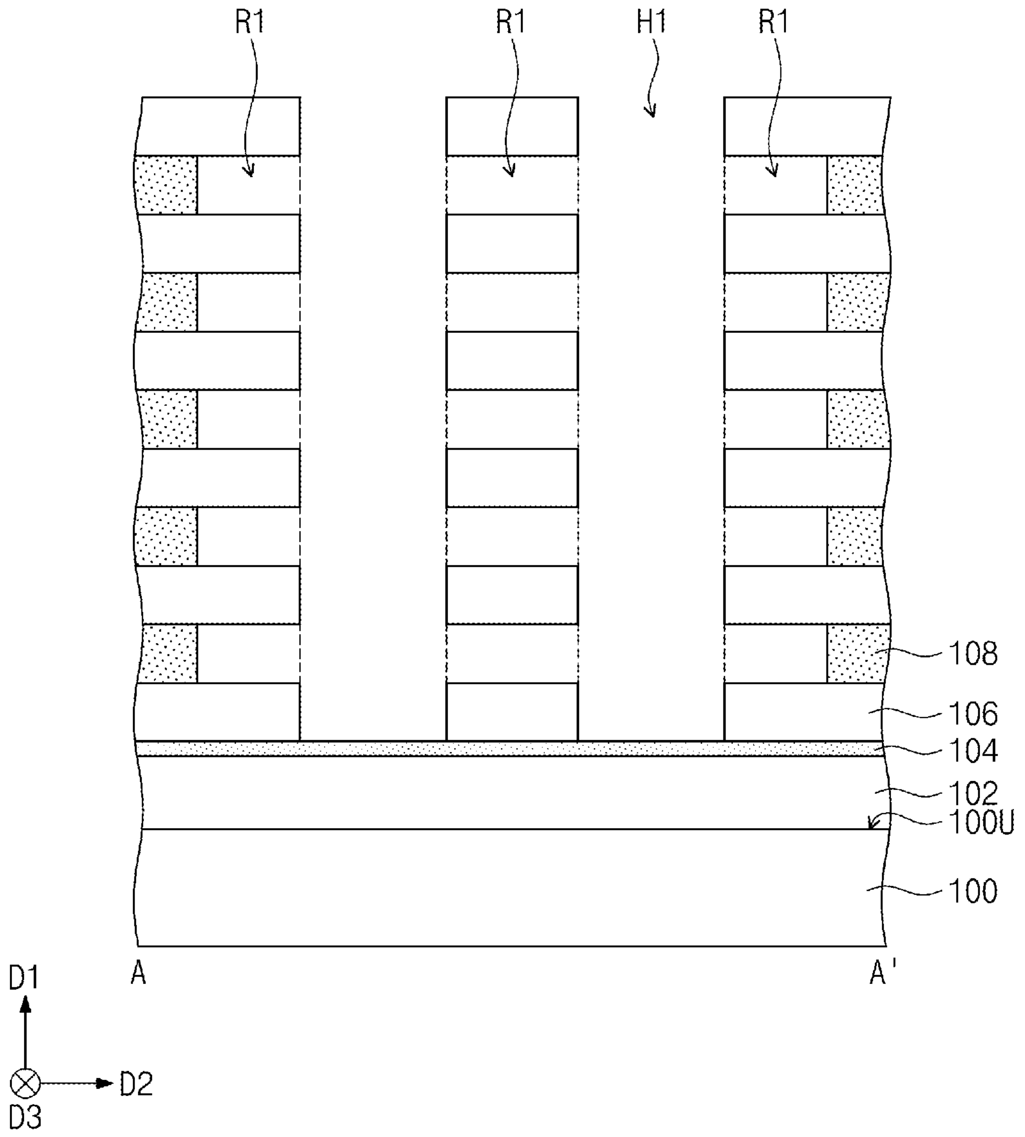

Referring to FIGS. 16 and 17, first recess regions R1 may be formed. The first recess regions R1 may be formed by etching side surfaces of the second insulating patterns 108 exposed by the first holes H1. The second insulating patterns 108, which are located between the first holes H1 that are adjacent to each other in the second direction D2, may be fully etched such that any remaining portion of the second insulating pattern 108 is not left between the first holes H1. The first recess regions R1 may be spaced apart from each other in the first direction D1 and may be respectively interposed between the first insulating patterns 106. Each of the first recess regions R1 may be formed to enclose a corresponding one of the first holes H1, when viewed in a plan view. Each of the first recess regions R1 may be extended in the third direction D3. In an embodiment, the formation of the first recess regions R1 may include laterally etching the exposed side surfaces of the second insulating patterns 108 using an etching process having an etch selectivity with respect to the second insulating patterns 108.

Figure 18:
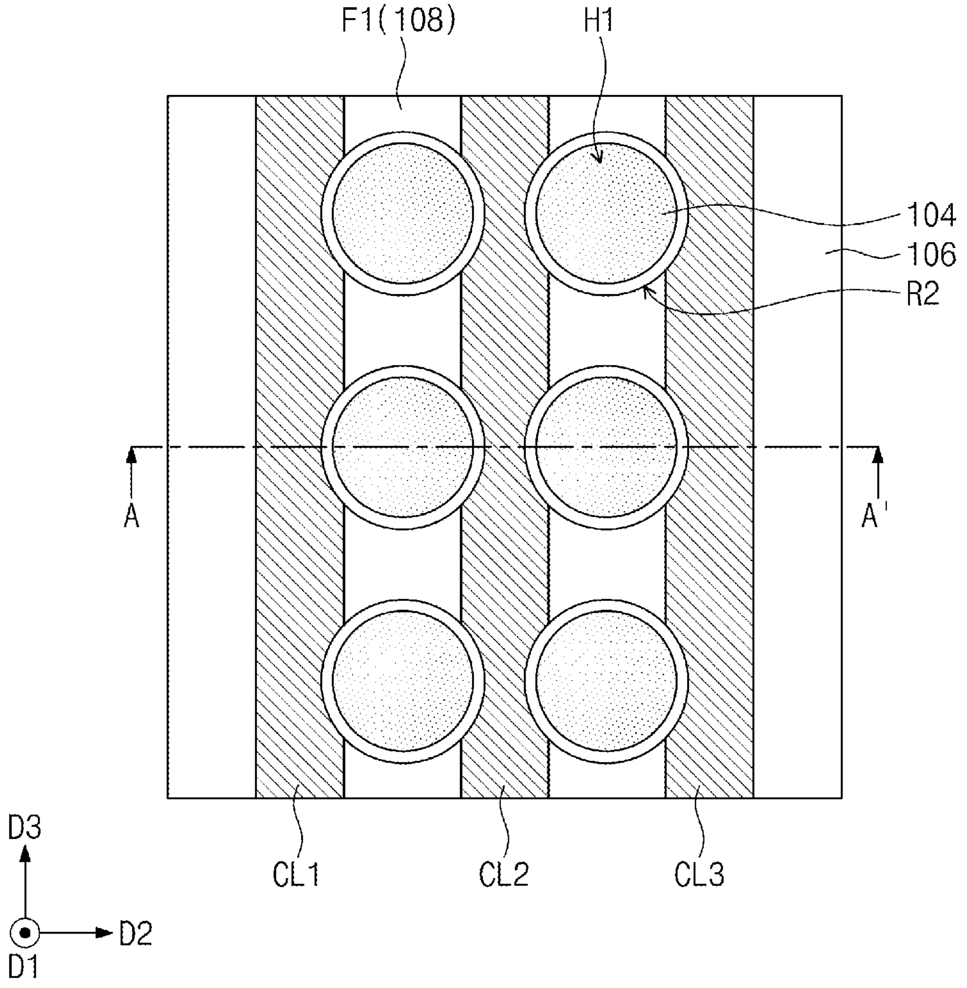
Figure 19:
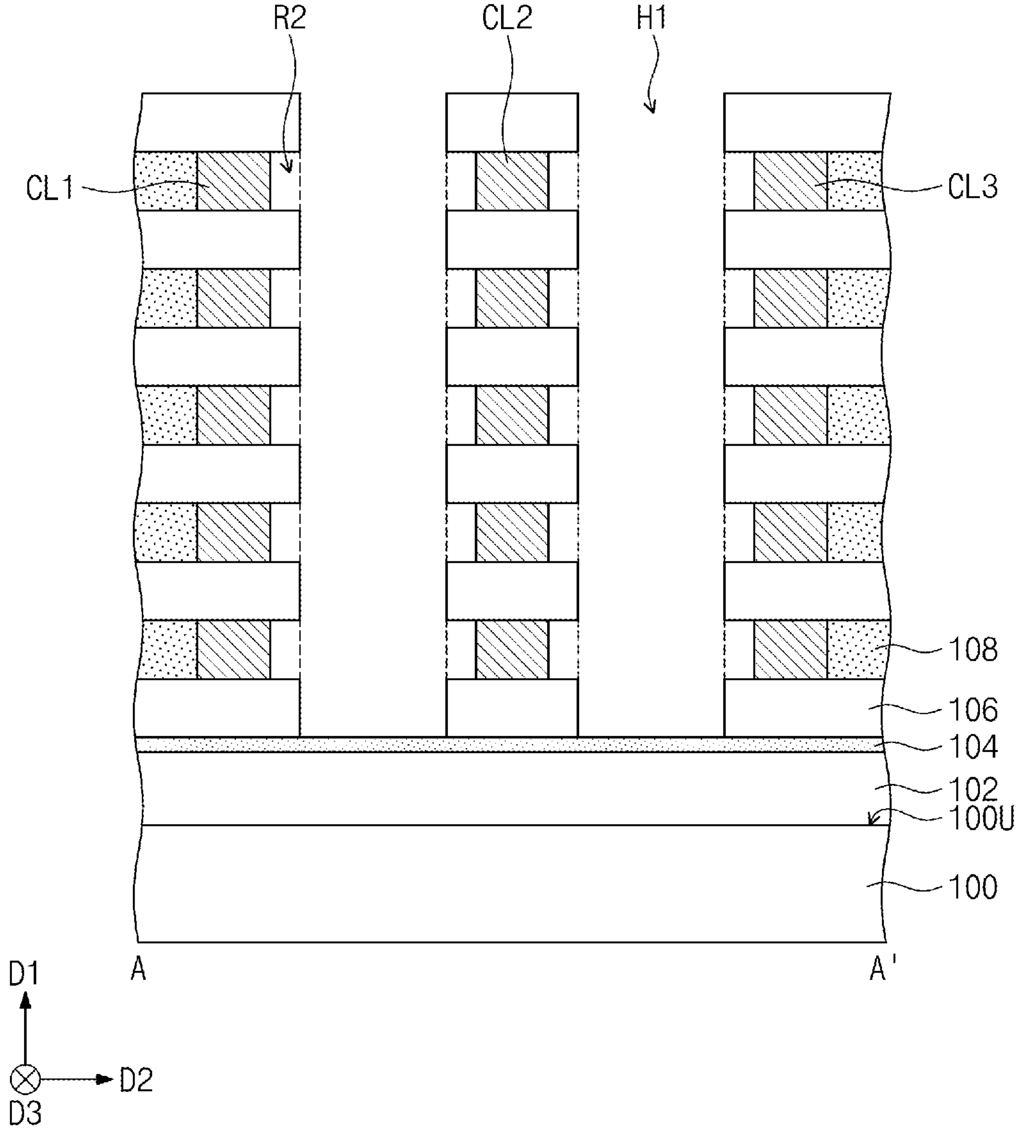

Referring to FIGS. 18 and 19, first conductive lines CL1, second conductive lines CL2, and third conductive lines CL3 may be formed in the first recess regions R1, respectively. The first conductive lines CL1 may be formed in corresponding ones of the first recess regions R1. The first conductive lines CL1 may be in contact with side surfaces of remaining portions of the second insulating patterns 108. The third conductive lines CL3 may be formed in corresponding ones of the first recess regions R1. The third conductive lines CL3 may be in contact with side surfaces of remaining portions of the second insulating patterns 108. The second conductive lines CL2 may be formed in corresponding ones of the first recess regions R1. The first recess regions R1 provided with the second conductive lines CL2 may be the first recess regions R1, from which the second insulating patterns 108 are fully removed.

The first conductive lines CL1, the second conductive lines CL2, and the third conductive lines CL3 may be interposed between the first insulating patterns 106. The first conductive lines CL1 may be spaced apart from each other in the first direction D1 and may be extended in the third direction D3. The second conductive lines CL2 may be spaced apart from the first conductive lines CL1 in the second direction D2 and may be extended in the third direction D3. The third conductive lines CL3 may be spaced apart from the second conductive lines CL2 in the second direction D2 and may be extended in the third direction D3. Portions of the first recess regions R1, which are not filled with the first conductive lines CL1, the second conductive lines CL2, and the third conductive lines CL3, will be referred to as 'second recess regions R2'.

Figure 20:
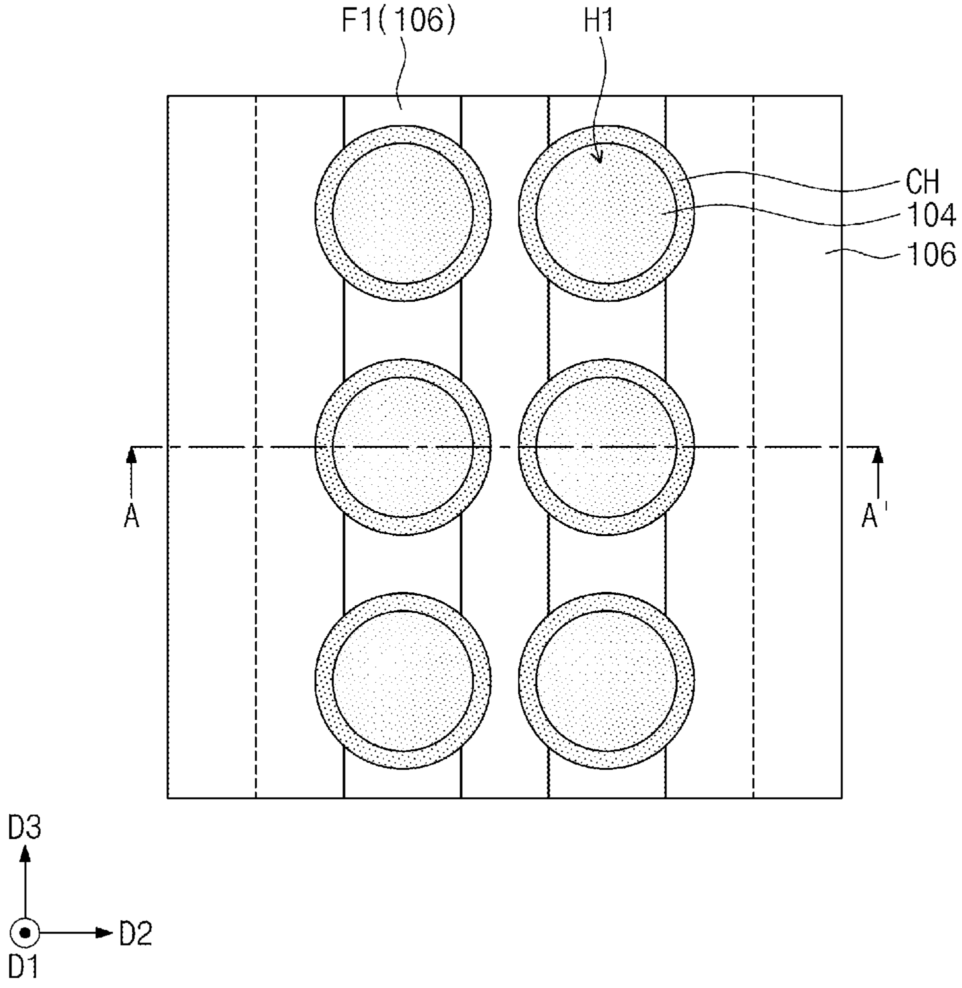
Figure 21:
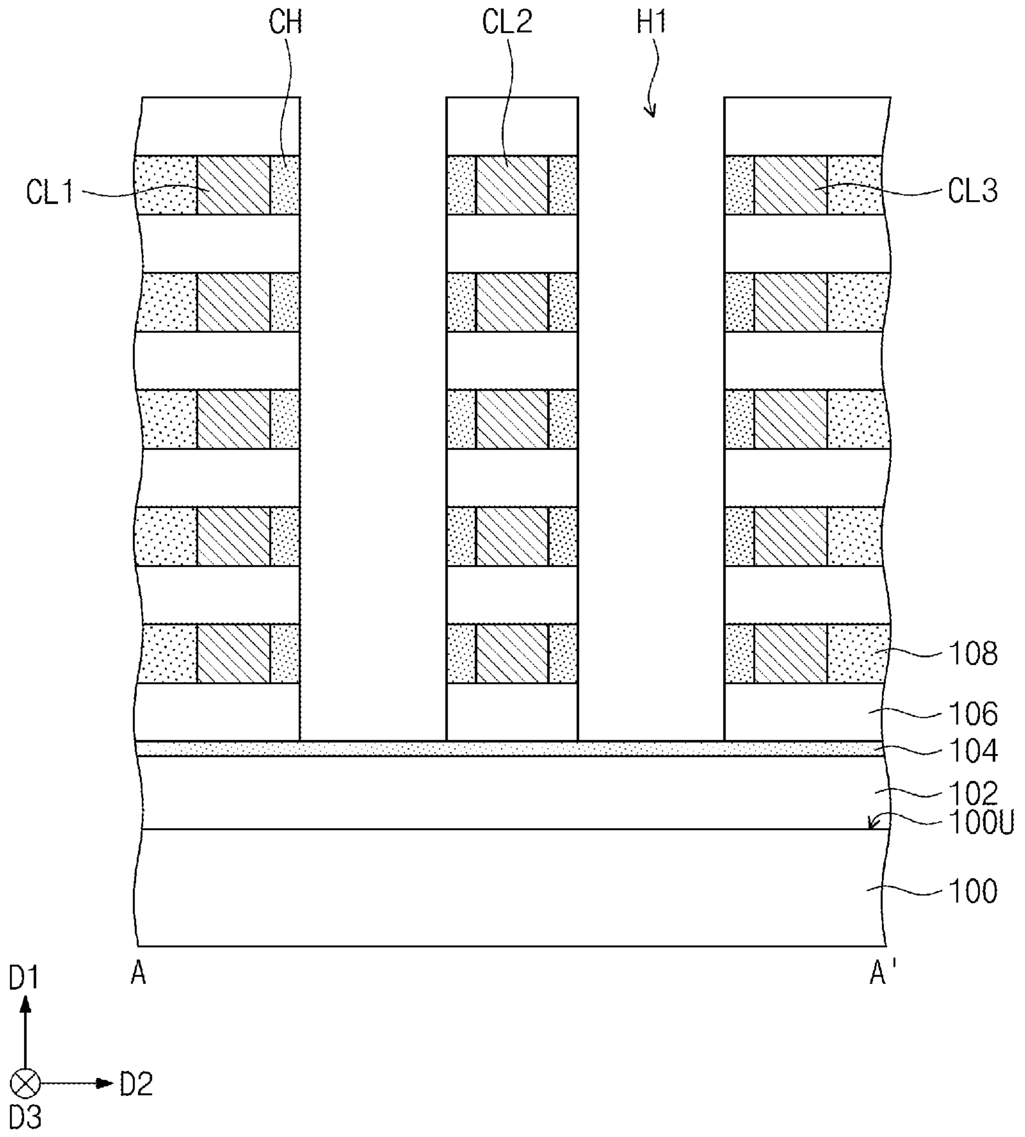

Referring to FIGS. 20 and 21, a plurality of channel patterns CH may be formed in the second recess regions R2, respectively. For example, each of the channel patterns CH may be formed to fill a corresponding one of the second recess regions R2. Each of the channel patterns CH may be in contact with a corresponding one of the first conductive lines CL1 or the third conductive lines CL3. Each of the channel patterns CH may be in contact with a corresponding one of the second conductive lines CL2. Each of the channel patterns CH may be a ring-shaped pattern enclosing a corresponding one of the first holes H1.

Figure 22:
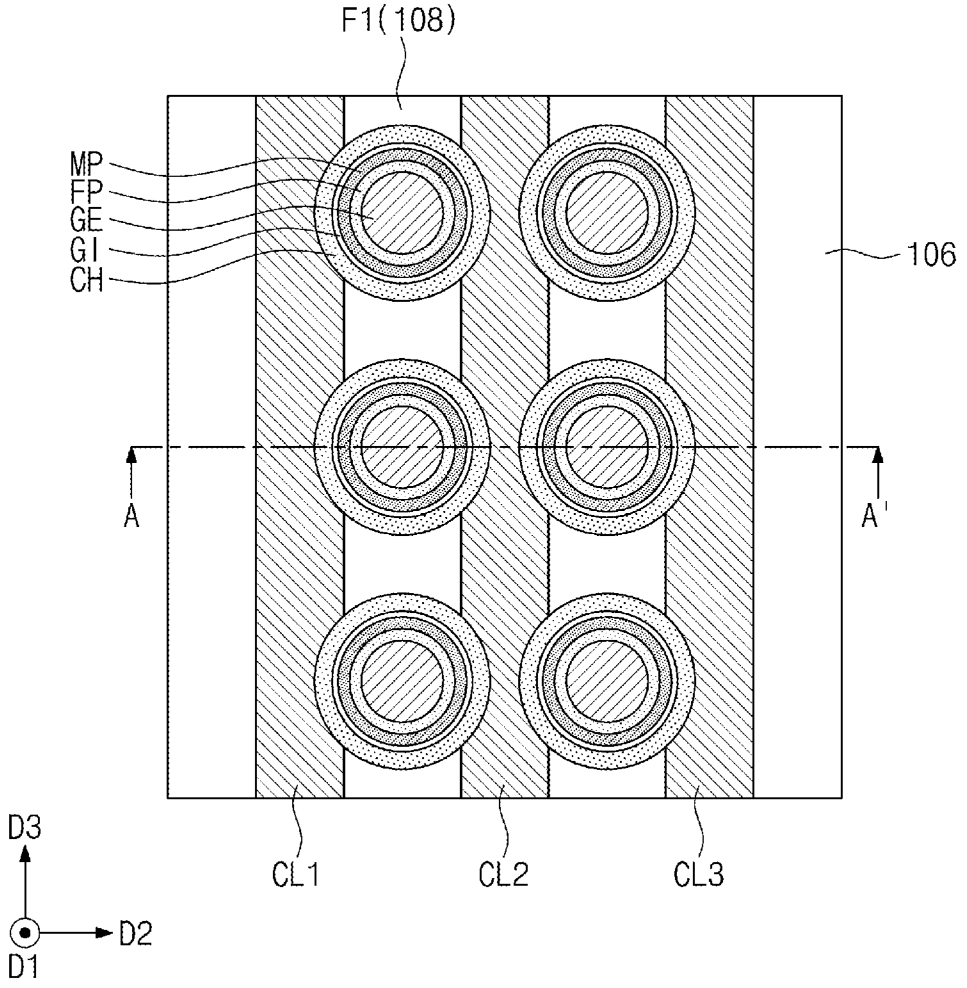
Figure 23:
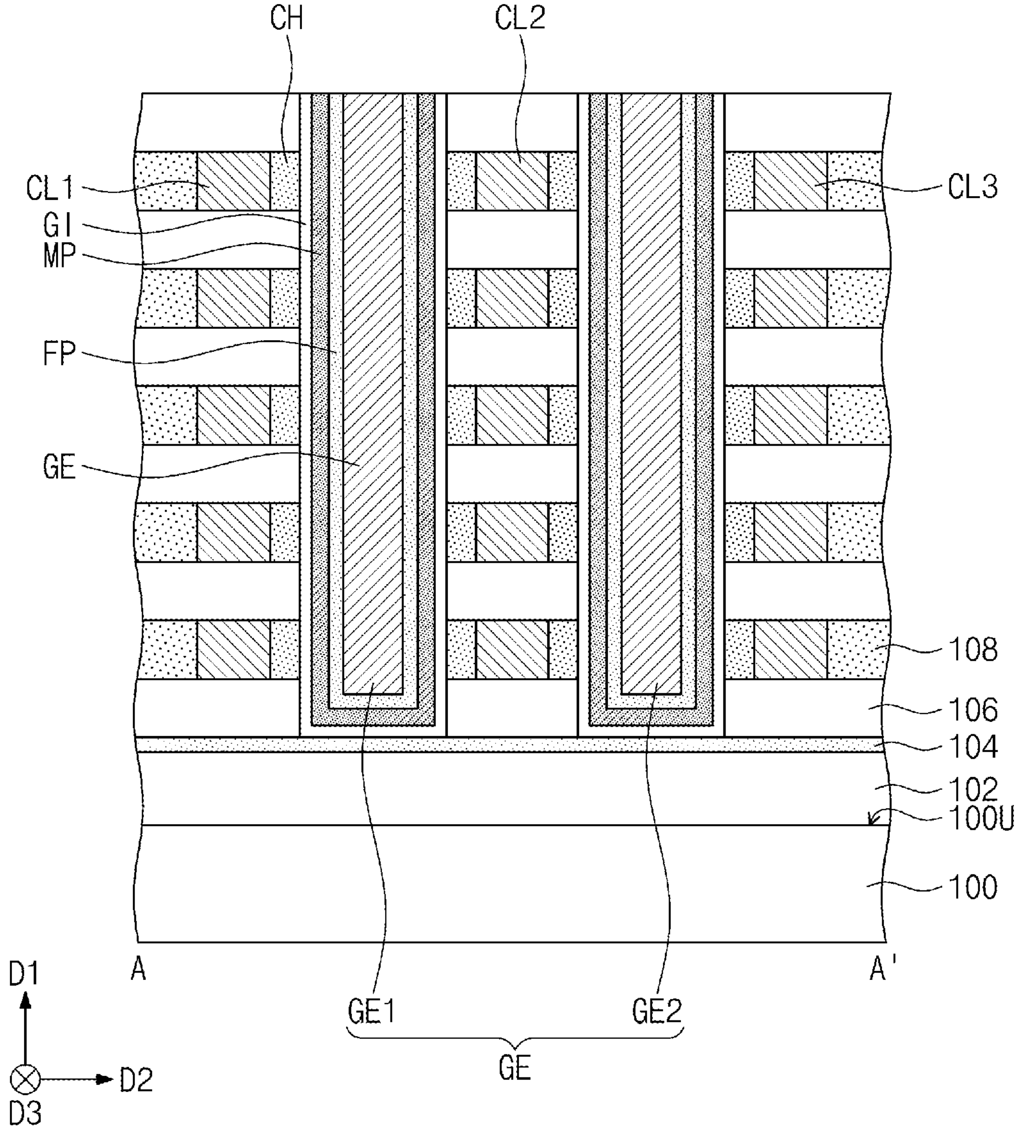

Referring to FIGS. 22 and 23, a gate insulating pattern GI, a metal pattern MP, a ferroelectric pattern FP, and gate electrodes GE may be formed in the first hole H1. The gate insulating pattern GI may be provided to conformally cover an inner surface of each of the first holes H1. The gate insulating pattern GI may be provided to cover the side surfaces of the channel patterns CH and the first insulating patterns 106 and to cover the top surface of the etch stop layer 104. The metal pattern MP may be provided to conformally cover an inner surface of each of the gate insulating patterns GI. In an embodiment, the ferroelectric pattern FP may be provided to conformally cover an inner surface of each of the metal patterns MP. Each of the gate electrodes GE may be formed to fill a remaining portion of each of the first holes H1.

Referring back to FIGS. 2 and 3, the insulating sidewall patterns 130 may be formed on side surfaces of the first and third conductive lines CL1 and CL3. For example, the formation of the insulating sidewall patterns 130 may include etching the second insulating patterns 108, which are left on the side surfaces of the first and third conductive lines CL1 and CL3, and the first insulating patterns 106, which are overlapped with the second insulating patterns 108, and filling the etched regions with an insulating material. The insulating sidewall patterns 130 may be line-shaped patterns extended in the third direction D3. As a result of the above steps, a semiconductor device may be fabricated to have a structure described with reference to FIGS. 2 and 3.

Figure 24:
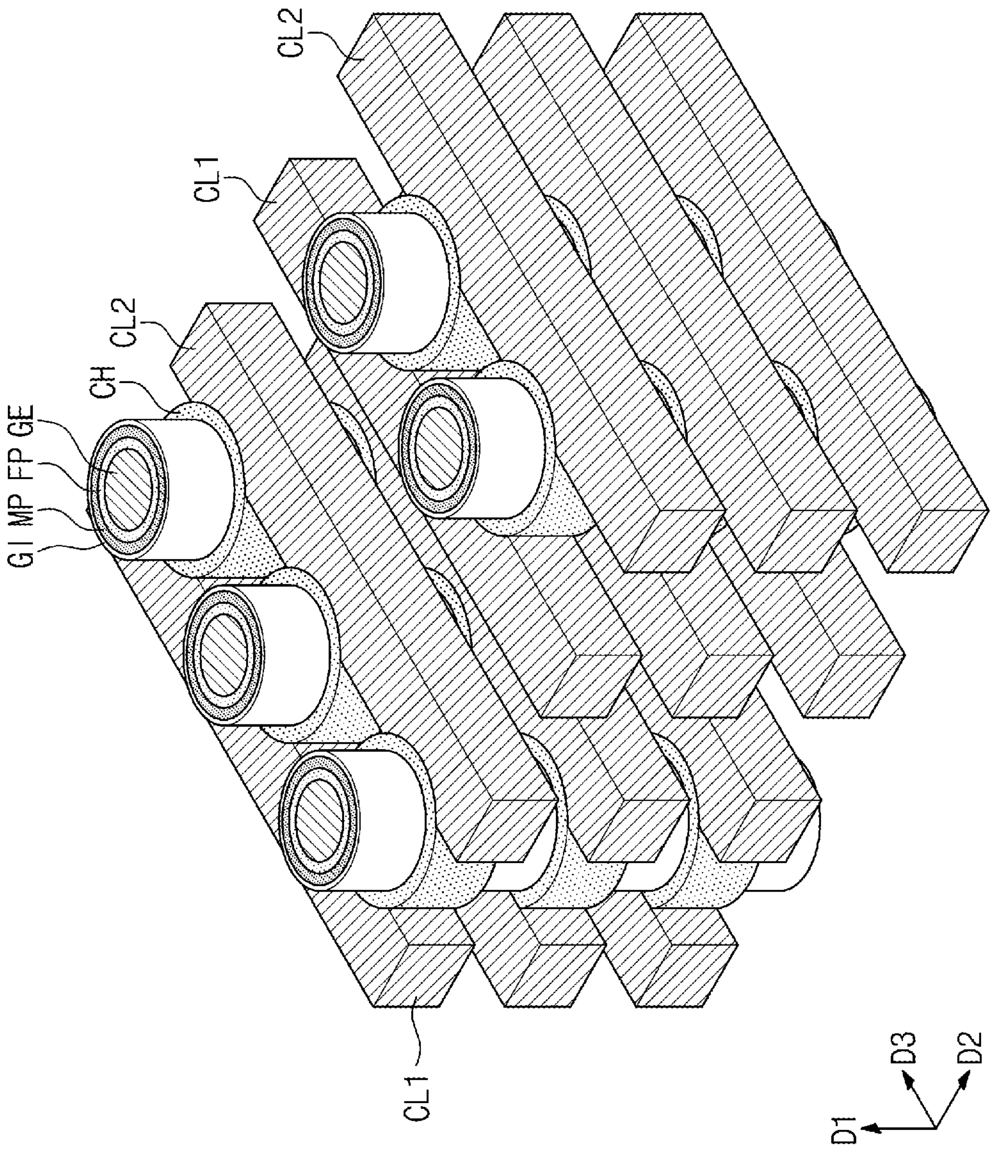
FIG. 24 is a perspective view schematically illustrating a semiconductor device according to an embodiment of the inventive concept.
Figure 25:
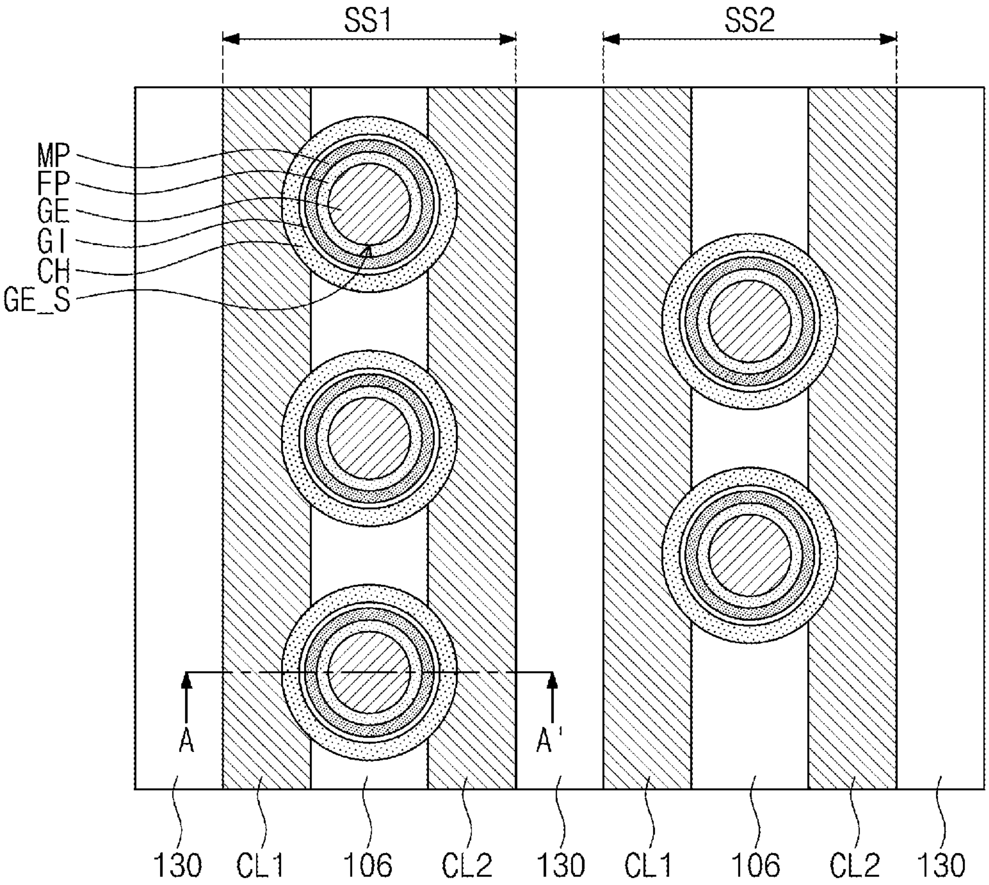
FIG. 25 is a plan view illustrating a semiconductor device according to an embodiment of the inventive concept.
Figure 26:
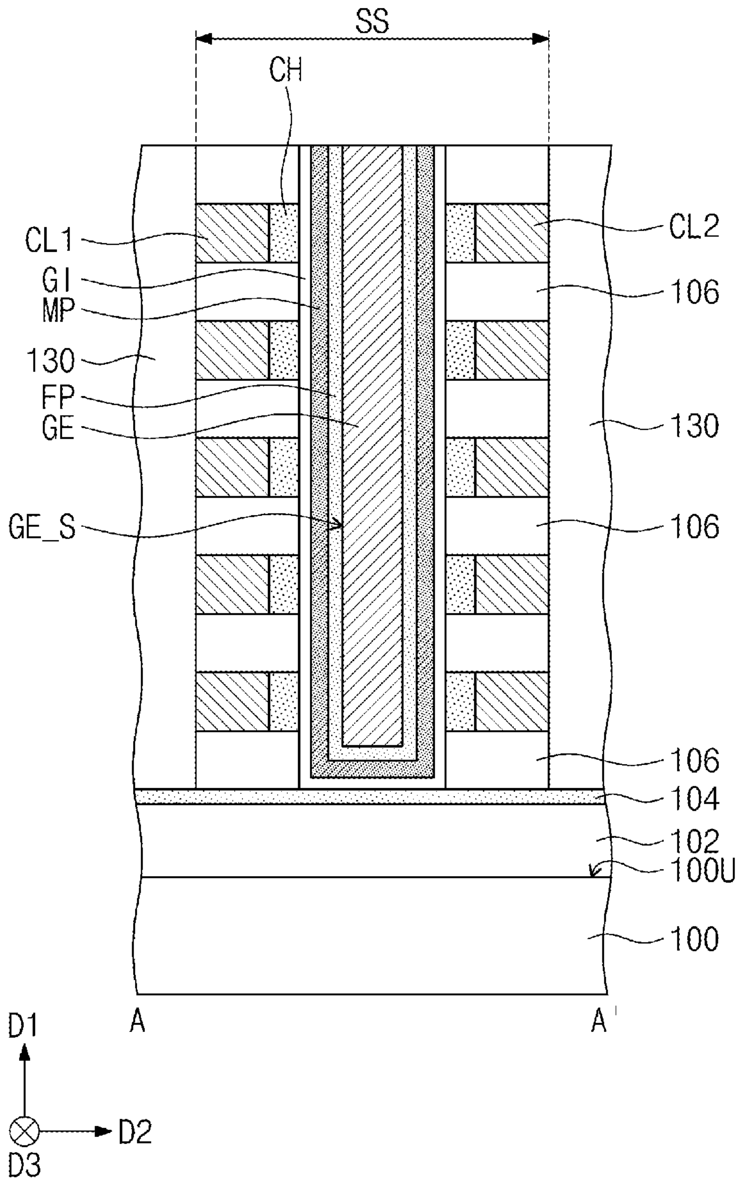
FIG. 26 is a sectional view taken along a line A-A' of FIG. 25.

FIG. 24 is a perspective view schematically illustrating a semiconductor device according to an embodiment of the inventive concept. FIG. 25 is a plan view illustrating a semiconductor device according to an embodiment of the inventive concept. FIG. 26 is a sectional view taken along a line A-A' of FIG. 25. For the sake of brevity, features, which are different from the semiconductor device described with reference to FIGS. 1 to 3, will be mainly described below.

Referring to FIGS. 24 to 26, a stack SS may include first conductive lines CL1, second conductive lines CL2, gate electrodes GE, a ferroelectric pattern FP, a metal pattern MP, a gate insulating pattern GI, channel patterns CH, and first insulating patterns 106. In the present embodiment, the stack SS may not include the third conductive lines CL3 described with reference to FIGS. 1 to 3. The gate electrodes GE may be disposed between the first conductive lines CL1 and the second conductive lines CL2. The channel patterns CH may be disposed to enclose a side surface GE_S of each of the gate electrodes GE. Each of the channel patterns CH may be connected to the first conductive lines CL1 and the second conductive lines CL2.

The stack SS may include a first stack SS1 and a second stack SS2. Insulating sidewall patterns 130 may be further disposed between the stacks SS1 and SS2. The first stack SS1 and the second stack SS2 may be spaced apart from each other in the second direction D2 with the insulating sidewall patterns 130 interposed therebetween. The second stack SS2 may be offset from the first stack SS1 in the third direction D3. For example, the first stack SS1 and the second stack SS2 may not be aligned along the second direction D2. In other words, the gate electrodes GE in the second stack SS2 may be offset from the gate electrodes GE in the first stack SS1 in the third direction D3. Thus, the gate electrodes GE in the second stack SS2 and the gate electrodes GE in the first stack SS1 may be arranged in a zigzag shape.

According to an embodiment of the inventive concept, it may be possible to reduce an area of a cell array, compared to the case of disposing a plurality of ferroelectric field effect transistors in a planar manner, and thereby to easily increase an integration density of a semiconductor device. In addition, gate electrodes of the ferroelectric field effect transistors may be disposed in an offset manner, and in this case, it may be possible to reduce a disturbance issue, which is caused by voltages applied to the gate electrodes. Accordingly, it may be possible to improve operational and reliability characteristics of the semiconductor device.

While example embodiments of the inventive concept have been particularly shown and described, it will be understood by one of ordinary skill in the art that variations in form and detail may be made therein without departing from the scope of the attached claims.

What is claimed is:

1. A semiconductor device, comprising:

first conductive lines on a substrate and spaced apart from each other in a first direction perpendicular to a top surface of the substrate;

second conductive lines spaced apart from the first conductive lines in a second direction parallel to the top surface of the substrate;

third conductive lines spaced apart from the second conductive lines in the second direction;

gate electrodes between the first conductive lines and the second conductive lines and between the second conductive lines and the third conductive lines and extending in the first direction;

ferroelectric patterns on respective side surfaces of the gate electrodes;

gate insulating patterns on the respective side surfaces of the gate electrodes and spaced apart from the respective side surfaces of the gate electrodes with the ferroelectric patterns respectively therebetween; and channel patterns extending along respective side surfaces of the gate insulating patterns, wherein each of the channel patterns is electrically connected to a respective one of the second conductive lines and is electrically connected to a respective one of the first conductive lines or a respective one of the third conductive lines; and wherein each respective one of the channel patterns intersects, in the second direction, a respective one of the second conductive lines such that for each of the respective ones of the channel patterns and second conductive lines, a level of the respective channel pattern is disposed between, in the first direction, at least a portion of a top face of the respective second conductive line and at least a portion of a bottom face of the respective second conductive line.

2. The semiconductor device of claim 1, wherein the gate electrodes comprise first gate electrodes that are between the first conductive lines and the second conductive lines, and second gate electrodes that are between the second conductive lines and the third conductive lines, and the first gate electrodes and the second gate electrodes are offset from each other in a third direction that is parallel to the top surface of the substrate and is non-parallel to the second direction.

3. The semiconductor device of claim 1, wherein the second conductive lines are between the first conductive lines and the third conductive lines.

4. The semiconductor device of claim 1, wherein the first conductive lines extend in a third direction which is parallel to the top surface of the substrate and is non-parallel to the second direction, the second conductive lines are spaced apart from each other in the first direction and extend in the third direction, and the third conductive lines are spaced apart from each other in the first direction and extend in the third direction.

5. The semiconductor device of claim 1, further comprising first insulating patterns, wherein the first insulating patterns are spaced apart from each other in the first direction and are alternately stacked with the channel patterns in the first direction.

6. The semiconductor device of claim 5, wherein the first insulating patterns extend in a third direction that is parallel to the top surface of the substrate and is non-parallel to the second direction and are on the respective side surfaces of the gate electrodes.

7. The semiconductor device of claim 1, further comprising metal patterns on the respective side surfaces of the gate electrodes, wherein each of the metal patterns is between a respective one of the gate insulating patterns and a respective one of the ferroelectric patterns.

8. The semiconductor device of claim 7, wherein the metal patterns extend in the first direction and are on side and bottom surfaces of the ferroelectric patterns, respectively.

9. The semiconductor device of claim 1, wherein the ferroelectric patterns are on bottom surfaces of the gate electrodes, respectively, and the gate insulating patterns are on side and bottom surfaces of the ferroelectric patterns, respectively.

10. The semiconductor device of claim 1, wherein the gate electrodes comprise first gate electrodes that are between the first conductive lines and the second conductive lines, and the first gate electrodes overlap the first conductive lines and the second conductive lines in the second direction.

11. A semiconductor device, comprising:

first insulating patterns stacked on a substrate and spaced apart from each other in a first direction perpendicular to a top surface of the substrate;

first conductive lines and second conductive lines on the substrate, wherein the second conductive lines are spaced apart from the first conductive lines in a second direction parallel to the top surface of the substrate;

a first gate electrode that is spaced apart from the first conductive lines and the second conductive lines and extends in the first direction;

channel patterns that are spaced apart from each other in the first direction and extend along a side surface of the first gate electrode;

a ferroelectric pattern between the channel patterns and the first gate electrode; and a gate insulating pattern between the channel patterns and the ferroelectric pattern, wherein the first insulating patterns are alternately stacked with the channel patterns in the first direction, each respective one of the channel patterns intersects, in the second direction, a respective one of the second conductive lines such that for each of the respective ones of the channel patterns and second conductive lines, a level of the respective channel pattern is disposed between, in the first direction, at least a portion of a top face of the respective second conductive line and at least a portion of a bottom face of the respective second conductive line; and the channel patterns are electrically connected to the second conductive lines, respectively.

12. The semiconductor device of claim 11, further comprising:

third conductive lines spaced apart from each other in the first direction, wherein the second conductive lines are between the first conductive lines and the third conductive lines; and a second gate electrode between the second conductive lines and the third conductive lines, wherein the first gate electrode is between the first conductive lines and the second conductive lines, and the first gate electrode and the second gate electrode are offset from each other in a third direction that is parallel to the top surface of the substrate and is non-parallel to the second direction.

13. The semiconductor device of claim 11, further comprising a metal pattern between the channel patterns and the ferroelectric pattern, wherein the metal pattern is between the gate insulating pattern and the ferroelectric pattern.

14. The semiconductor device of claim 13, wherein the metal pattern extends in the first direction and is on side and bottom surfaces of the ferroelectric pattern.

15. The semiconductor device of claim 11, wherein the ferroelectric pattern is on side and bottom surfaces of the first gate electrode, and the gate insulating pattern is on side and bottom surfaces of the ferroelectric pattern.

16. The semiconductor device of claim 11, wherein the first conductive lines are spaced apart from each other in the first direction and extend in a third direction that is parallel to the top surface of the substrate and is non-parallel to the second direction, and the second conductive lines are spaced apart from each other in the first direction and extend in the third direction.

17. The semiconductor device of claim 12, wherein the first conductive lines and the third conductive lines are bit lines, and the second conductive lines are source lines.

18. A semiconductor device, comprising:

a substrate;

first conductive lines on the substrate and spaced apart from each other in a first direction perpendicular to a top surface of the substrate;

second conductive lines spaced apart from the first conductive lines in a second direction parallel to the top surface of the substrate;

third conductive lines spaced apart from the second conductive lines in the second direction, the second conductive lines being between the first conductive lines and the third conductive lines;

gate electrodes that are on the substrate, are spaced apart from each other, and extend in the first direction, the gate electrodes comprising a first gate electrode between the first conductive lines and the second conductive lines and a second gate electrode between the second conductive lines and the third conductive lines;

channel patterns extending along respective side surfaces of the gate electrodes;

ferroelectric patterns on the respective side surfaces of the gate electrodes;

gate insulating patterns on the respective side surfaces of the gate electrodes and spaced apart from the respective side surfaces of the gate electrodes with the ferroelectric patterns respectively therebetween; and first insulating patterns alternately stacked with ones of the channel patterns in the first direction, wherein the first gate electrode and the second gate electrode are offset from each other in a third direction that is parallel to the top surface of the substrate and is non-parallel to the second direction, each respective one of the channel patterns intersects, in the second direction, a respective one of the second conductive lines such that for each of the respective ones of the channel patterns and second conductive lines, a level of the respective channel pattern is disposed between, in the first direction, at least a portion of a top face of the respective second conductive line and at least a portion of a bottom face of the respective second conductive line; and each of the channel patterns is electrically connected to a respective one of the second conductive lines and is electrically connected to a respective one of the first conductive lines or a respective one of the third conductive lines.

19. The semiconductor device of claim 18, wherein the first conductive lines and the third conductive lines are bit lines, and the second conductive lines are source lines.

* * * * *